(12) United States Patent
Jeon et al.

(10) Patent No.: US 12,317,536 B2
(45) Date of Patent: May 27, 2025

(54) SEMICONDUCTOR DEVICE AND POWER SWITCHING SYSTEM INCLUDING THE SAME

(71) Applicant: Samsung Electronics Co., Ltd., Suwon-si (KR)

(72) Inventors: Woochul Jeon, Suwon-si (KR); Jaejoon Oh, Seongnam-si (KR); Sunkyu Hwang, Seoul (KR); Jongseob Kim, Seoul (KR); Soogine Chong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 232 days.

(21) Appl. No.: 17/517,987

(22) Filed: Nov. 3, 2021

(65) Prior Publication Data

US 2022/0393029 A1 Dec. 8, 2022

(30) Foreign Application Priority Data

Jun. 2, 2021 (KR) .................. 10-2021-0071478

(51) Int. Cl.
*H10D 30/62* (2025.01)
*H10D 62/85* (2025.01)
*H10D 84/83* (2025.01)

(52) U.S. Cl.
CPC ..... *H10D 30/6211* (2025.01); *H10D 62/8503* (2025.01); *H10D 84/834* (2025.01)

(58) Field of Classification Search
CPC ............... H01L 21/845; H01L 27/0924; H01L 27/0886; H01L 27/10826; H01L 27/10879;

(Continued)

(56) References Cited

U.S. PATENT DOCUMENTS 8,803,207 B2 * 8/2014 Grebs ............... H01L 29/66719
257/E21.549
8,907,394 B2 12/2014 Hossain
(Continued)

FOREIGN PATENT DOCUMENTS

JP 5578873 B2 8/2014

OTHER PUBLICATIONS

Zhang, et al. "Large Area 1.2 kV GaN Vertical Power FinFETs with a Record Switching Figure-of-Merit," MIT Libraries, MIT Open Access Articles, IEEE Electron Device Letters 40, Published as: http://dx.doi.org/10.1109/led.2018.2880306 No. 1, pp. 75-78 (2019).

(Continued)

*Primary Examiner* — Vu A Vu
*Assistant Examiner* — Valerie N Newton
(74) *Attorney, Agent, or Firm* — Harness, Dickey & Pierce, P.L.C.

(57) ABSTRACT

A semiconductor device includes: a semiconductor substrate including a first surface and a second surface facing each other and including a first semiconductor material; a plurality of fin structures upwardly extending on the first surface of the semiconductor substrate, spaced apart from each other by a plurality of trenches, and including the first semiconductor material as the semiconductor substrate; an insulating layer on the first surface of the semiconductor substrate filling at least a portion of the plurality of trenches; a gate electrode layer between the plurality of fin structures and surrounded by the insulating layer; a first conductive layer covering the plurality of fin structures; a second conductive layer on the second surface of the semiconductor substrate; and a shield layer between the gate electrode layer and the semiconductor substrate, surrounded by the insulating layer, and electrically connected to the first conductive layer.

19 Claims, 16 Drawing Sheets

(58) Field of Classification Search
CPC ........... H01L 27/1211; H01L 29/41791; H01L 29/66795; H01L 29/785; H01L 2029/7858; H10B 12/056; H10B 12/36; H10D 30/6211; H10D 84/834; H10H 20/8314
See application file for complete search history.

(56) References Cited

U.S. PATENT DOCUMENTS

| | | |
|---|---|---|
| 9,502,550 B2 | 11/2016 | Padmanabhan et al. |
| 2007/0001173 A1 | 1/2007 | Brask et al. |
| 2011/0024794 A1 | 2/2011 | Ko et al. |
| 2014/0084299 A1 | 3/2014 | Schelling et al. |
| 2016/0247685 A1* | 8/2016 | Chen .................. H01L 21/3065 |
| 2019/0371895 A1 | 12/2019 | Li et al. |
| 2020/0135915 A1* | 4/2020 | Savant ................ H01L 21/0228 |
| 2020/0212219 A1* | 7/2020 | Kim .................... H01L 29/7806 |
| 2021/0074840 A1* | 3/2021 | Chen ............... H01L 21/823821 |
| 2023/0060545 A1* | 3/2023 | Du .......................... H10K 59/00 |
| 2023/0118158 A1* | 4/2023 | Krebs .................. H01L 29/785 |
| | | 257/368 |

OTHER PUBLICATIONS

Dr. Dusan Graovac "Parasitic Turn-on of Power MOSFET—How to avoid it?" pp. 1-7 (2008).
Zhang, et al. "Large Area 1.2 kV GaN Vertical Power FinFETs with a Record Switching Figure-of-Merit," IEEE Electron Device Letters 40, Published as: http://dx.doi.org/10.1109/led.2018.2880306 No. 1, pp. 75-78 (2019).

* cited by examiner

SEMICONDUCTOR DEVICE AND POWER SWITCHING SYSTEM INCLUDING THE SAME

CROSS-REFERENCE TO RELATED APPLICATION

This application is based on and claims priority under 35 U.S.C. § 119 to Korean Patent Applications No. 10-2021-0071478, filed on Jun. 2, 2021, in the Korean Intellectual Property Office, the disclosure of which is incorporated by reference herein in its entirety.

BACKGROUND

Some example embodiments relate to a semiconductor device and/or a power switching system including the same, and more particularly, to a semiconductor device including a vertical channel and/or a power switching system including the semiconductor device.

Semiconductor switching devices, such as diodes, thyristors, bipolar transistors, and/or metal-oxide semiconductor field-effect transistor (MOSFETs), etc. have been widely used in various electronic devices. Semiconductor switching devices are used, for example, in a power switching system, a communication device, a controlling and monitoring device, and/or an amplification device, etc. The semiconductor switching devices may control currents based on on/off operations. Also, the performance of electronic devices may be dependent on the performance of semiconductor switching devices used in the electronic devices.

The characteristics required for the semiconductor switching devices include features such as high power efficiency, miniaturized size, high operation speed, low loss, high reliability, and/or the like. In particular, the operation speed of a semiconductor switching device may affect the power efficiency and the operation frequency, and thus, a semiconductor switching device having a high switching speed is required or is desired.

As a semiconductor switching device, a semiconductor switching device may have a FinFET structure including GaN. The semiconductor switching device having a FinFET structure may have a vertical channel, and thus, compared to other semiconductor switching devices having horizontal channels, may have a less leakage current and a higher switching efficiency.

SUMMARY

Provided is a semiconductor device having an improved switching speed based on a reduced capacitance between a gate electrode layer and a drain electrode layer and/or a power switching system including the semiconductor device.

Provided is a semiconductor device having an insulating layer structure distributing field effects which may be concentrated in a gate electrode layer and/or a power switching system including the semiconductor device.

Additional aspects will be set forth in part in the description which follows and, in part, will be apparent from the description, or may be learned by practice of some example embodiments.

According to some example embodiments, a semiconductor device includes: a semiconductor substrate including a first surface and a second surface facing each other, the semiconductor substrate including a first semiconductor material, a plurality of fin structures upwardly extending on the first surface of the semiconductor substrate, spaced apart from each other by a plurality of trenches, and including the first semiconductor material as the semiconductor substrate; an insulating layer on the first surface of the semiconductor substrate and filling at least a portion of the plurality of trenches, a gate electrode layer between the plurality of fin structures and surrounded by the insulating layer, a first conductive layer covering the plurality of fin structures and the insulating layer, a second conductive layer on the second surface of the semiconductor substrate, and a shield layer provided between the gate electrode layer and the semiconductor substrate, surrounded by the insulating layer, and electrically connected to the first conductive layer.

The plurality of fin structures may include a plurality of pillar shapes two-dimensionally arranged on the first surface of the semiconductor substrate.

The gate electrode layer may include a gate electrode grid pattern structure provided in a space between the plurality of fin structures.

The shield layer may include a shield layer grid pattern structure provided in a space between the plurality of fin structures.

The gate electrode layer may include a plurality of first gate electrode elements, extending in a first direction that is parallel with the first surface of the semiconductor substrate and arranged in parallel with each other, and a plurality of second gate electrode elements, extending in a second direction that is parallel with the first surface of the semiconductor substrate and crossing the first direction and are arranged in parallel with each other.

The shield layer may include a plurality of first shield elements, extending in the first direction and arranged in parallel with each other, and a plurality of second shield elements, extending in the second direction and arranged in parallel with each other.

A width in the second direction of the plurality of first shield elements may be less than or equal to a width in the second direction of the plurality of first gate electrode elements, and a width in the second direction of the plurality of second shield elements may be less than or equal to a width in the second direction of the plurality of second gate electrode elements.

The insulating layer may include: a first insulating layer on the first surface of the semiconductor substrate, filling at least a portion of the plurality of trenches and including a first groove in which the shield layer is arranged; a second insulating layer on the first insulating layer and including a second groove in which the gate electrode layer is arranged; and a third insulating layer provided on the second insulating layer and covering the gate electrode layer.

The first through third insulating layers may include the same dielectric material.

The plurality of fin structures may upwardly protrude from the insulating layer, and the first conductive layer may surround a side surface of a portion of the plurality of fin structures, the portion protruding from the insulating layer.

A lower edge area of the insulating layer, the lower edge area being adjacent to a lower portion of the plurality of fin structures, may have an increasing width away from the semiconductor substrate in a direction that is parallel with the extension direction of the plurality of fin structures.

The semiconductor device may further include: a plurality of first semiconductor contact layers between the plurality of fin structures and the first conductive layer and having a doping concentration that is greater than a doping concentration of the semiconductor substrate; and a second semiconductor contact layer between the semiconductor substrate and the second conductive layer and having a doping concentration that is greater than the doping concentration of the semiconductor substrate.

The semiconductor device may further include at least one inserted semiconductor layer embedded in an area of each of the plurality of fin structures, the area being adjacent to the gate electrode layer, the at least one inserted semiconductor layer including a second semiconductor material that is different from the first semiconductor material.

The gate electrode layer may include a gate body portion on the shield layer and a gate protrusion portion downwardly extending from an edge of the gate body portion to be adjacent to a side surface of the shield layer.

The insulating layer may include: a first insulating layer on the first surface of the semiconductor substrate, filling at least a portion of the plurality of trenches and defining a first groove in which the shield layer is arranged and a second groove into which the gate protrusion portion is inserted; a second insulating layer on the first insulating layer and defining a through-hole through which the gate protrusion portion penetrates; a third insulating layer provided on the second insulating layer and defining a third groove in which the gate body portion is arranged; and a fourth insulating layer on the third insulating layer and covering the gate body portion.

An upper surface of the plurality of fin structures may be located at the same height as an upper surface of the gate electrode layer.

Each of the plurality of fin structures may include a lower area having a large width and an upper area having a small width, smaller than the large width.

Each of the plurality of fin structures may include a tapered shape, a width of the tapered shape upwardly decreases.

Each of the plurality of fin structures may include a lower area and an upper area having large widths and a middle area between the lower area and the upper area and having a relatively small width, smaller than the large width.

The middle area may be adjacent to the gate electrode layer.

An area of the insulating layer may be inserted into the semiconductor substrate so as to be closer to the second conductive layer than other areas of the insulating layer the area being adjacent to an edge of the semiconductor substrate.

An area of the shield layer, may be more deeply inserted into the insulating layer so as to be closer to the second conductive layer compared to other areas of the shield layer, the area being adjacent to the edge of the semiconductor substrate.

The gate electrode layer may not be on an area of the insulating layer, the area being adjacent to an edge of the semiconductor substrate.

The first semiconductor material may include GaN.

The plurality of fin structures may extend in a first direction that is parallel with the first surface of the semiconductor substrate and may be arranged in parallel with each other.

The gate electrode layer may include a plurality of gate electrode elements, which extend in the first direction to be parallel with the plurality of fin structures and are arranged in parallel with each other.

The shield layer may include a plurality of shield elements, which extend in the first direction to be parallel with the plurality of fin structures and are arranged in parallel with each other.

According to some example embodiments, a power switching system includes the semiconductor device described above.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION OF SOME EXAMPLE EMBODIMENTS

Figure 1:
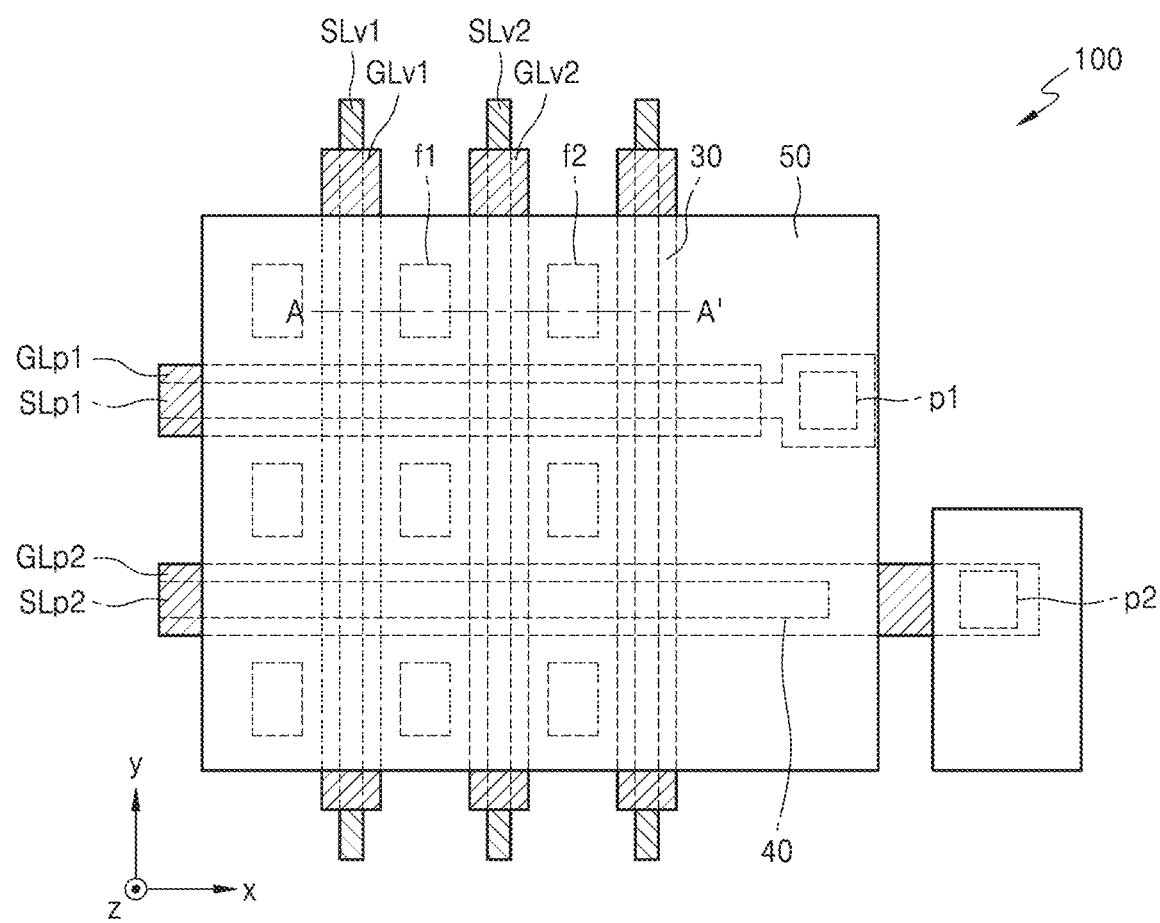
FIG. 1 is a plan view briefly illustrating an example structure of a semiconductor device according to some example embodiments.

Reference will now be made in detail to embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the drawings, sizes or thicknesses of elements may be exaggerated for clarity and convenience of explanation.

Although the terms first, second, etc. may be used herein to describe various elements, these terms do not limit the components. These terms are only used to distinguish one element from another.

Hereinafter, it will be understood that when an element is referred to as being "on" or "above" another element, the element can be directly over or under the other element and directly on the left or on the right of the other element, or intervening elements may also be present therebetween. As used herein, the singular terms "a" and "an" are intended to include the plural forms as well, unless the context clearly indicates otherwise.

Throughout the specification, it will be further understood that when a part "includes" or "comprises" an element, unless otherwise defined, the part may further include other elements, not excluding the other elements.

The term "the" and other equivalent determiners may correspond to a singular referent or a plural referent.

Example embodiments described are not necessarily mutually exclusive with one another. For example, one or more example embodiments may include features described with reference to one or more figures, and also may include features described with reference to one or other figures.

Figure 2:
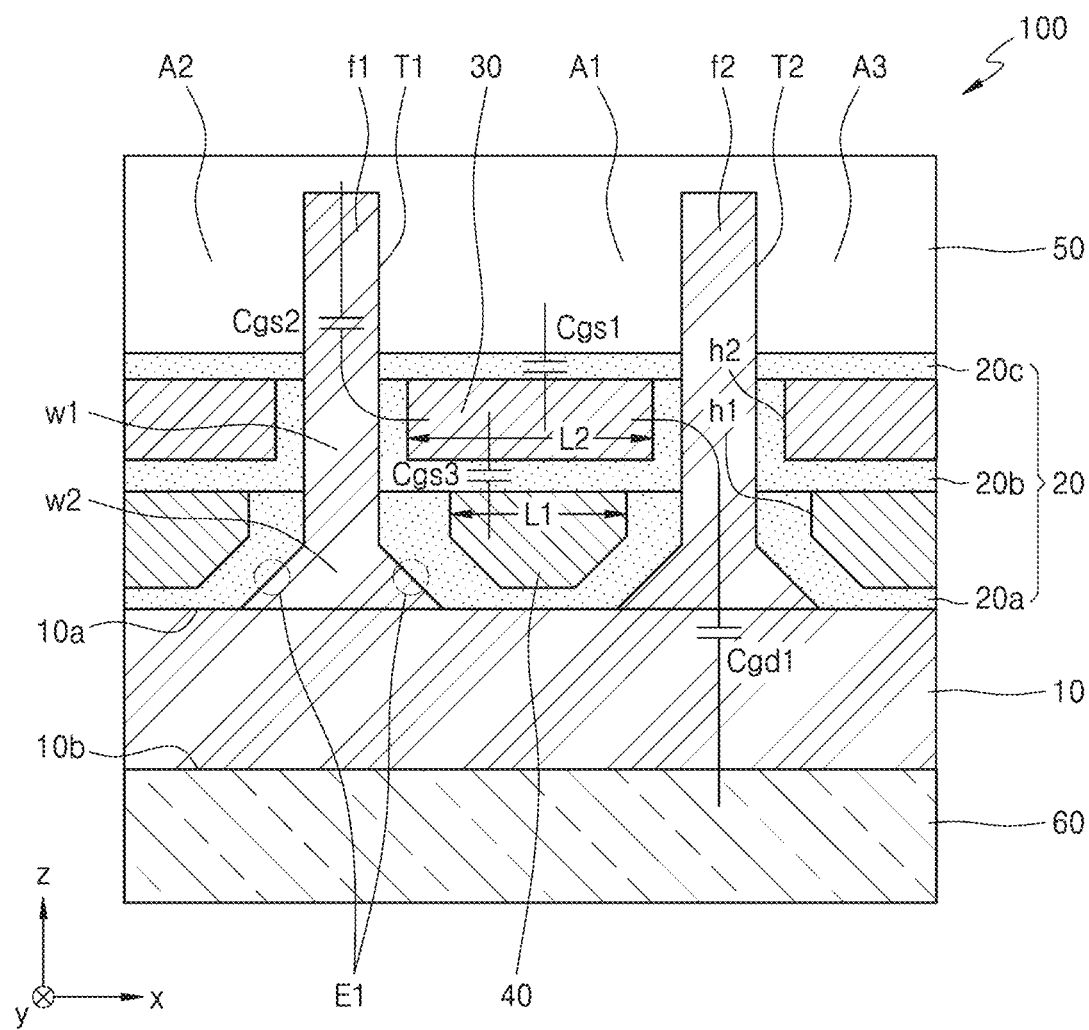
FIG. 2 is a lateral cross-sectional view briefly illustrating a cross-section of the semiconductor device, taken along line A-A' of FIG. 1.
Figure 3:
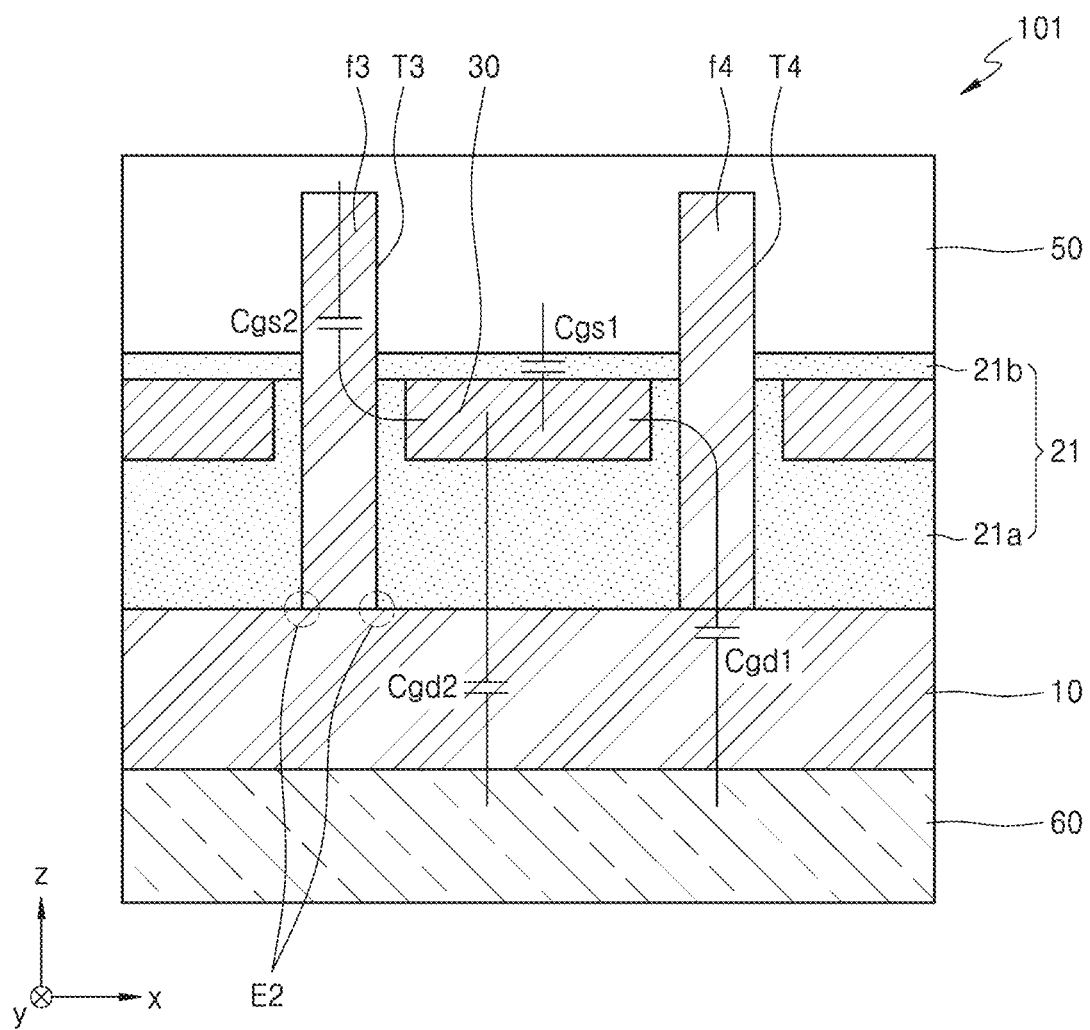
FIG. 3 is a lateral cross-sectional view briefly illustrating an example structure of a semiconductor device according to a comparative example.

FIG. 1 is a plan view briefly illustrating an example structure of a semiconductor device 100 according to some example embodiments. FIG. 2 is a lateral cross-sectional view briefly illustrating a cross-section of the semiconductor device 100, taken along A-A' of FIG. 1. FIG. 3 is a lateral cross-sectional view briefly illustrating an example structure of a semiconductor device 101 according to a comparative embodiment.

Referring to FIGS. 1 and 2, the semiconductor device 100 may include a semiconductor substrate 10, a plurality of fin structures f1 and f2, an insulating layer 20, a gate electrode layer 30, a shield layer 40, a first conductive layer 50, and a second conductive layer 60.

The semiconductor substrate 10 may have or include a first surface 10a and a second surface 10b facing each other. Here, the first surface 10a may refer to an upper surface of the semiconductor substrate 10, and the second surface 10b may refer to a lower surface of the semiconductor substrate 10.

The semiconductor substrate 10 may include a first semiconductor material. For example, the first semiconductor material may include GaN. GaN included in the first semiconductor material may be n-type GaN. For example, the semiconductor substrate 10 may include GaN doped (e.g. lightly doped with) with either or both of Si and Ge. However, the semiconductor substrate 10 is not limited thereto. The semiconductor substrate 10 may include GaN doped with one or more of P, As, and Sb.

The plurality of fin structures f1 and f2 may upwardly (a z-axis direction) extend on the first surface 10a of the substrate 10. FIG. 1 illustrates nine fin structures. However, it is for convenience of explanation, and the semiconductor device 100 may include more than nine fin structures or less than nine fin structures.

A channel area may be formed in the plurality of fin structures f1 and f2. For example, when a gate voltage equal to or greater than a threshold voltage is applied to the gate electrode layer 30 adjacent to the plurality of fin structures f1 and f2, the channel area may be formed in the plurality of fin structures f1 and f2. In this case, the channel area may be formed to extend in a direction parallel with a direction in which the plurality of fin structures f1 and f2 extend. After the channel area is formed, when a voltage is applied between the first conductive layer 50 and the second conductive layer 60, a dynamically determined (or, alternatively, predetermined) current may occur between the first conductive layer 50 and the second conductive layer 60 through the channel area formed in the plurality of fin structures f1 and f2.

The plurality of fin structures f1 and f2 may be spaced apart from each other by a plurality of trenches T1 and T2. For example, the plurality of fin structures f1 and f2 may include a plurality of pillar shapes spaced apart from each other by the plurality of trenches T1 and T2. For example, the plurality of fin structures f1 and f2 may include rectangular, e.g. square pillar shapes. However, the plurality of fin structures f1 and f2 are not limited thereto. The plurality of fin structures f1 and f2 may include various types of pillar shapes, such as cylindrical shapes, triangular prism shapes, square pillar shapes, etc.

The plurality of fin structures f1 and f2 having the plurality of pillar shapes may be two-dimensionally arranged on the first surface 10a of the semiconductor substrate 10. In this case, the plurality of fin structures f1 and f2 may be spaced apart from each other by the plurality of trenches T1 and T2. A plurality of spaces A1, A2, and A3 may be formed between the plurality of fin structures f1 and f2 that are spaced apart from each other.

The plurality of fin structures f1 and f2 may include the first semiconductor material as the semiconductor substrate 10. For example, the semiconductor substrate 10 and the plurality of fin structures f1 and f2 may include the same first semiconductor material and may be formed integrally with each other, e.g. formed at the same time via a process such as a Czochralski process. A width of the plurality of fin structures f1 and f2, the width being in a direction (an x-axis direction or a y-axis direction) that is parallel with the first surface 10a of the semiconductor substrate 10, may be about several nm to about dozens of nm. However, the width of the plurality of fin structures f1 and f2, the width being in the direction (the x-axis direction or the y-axis direction) that is parallel with the first surface 10a of the semiconductor substrate 10, is not limited thereto and may be about hundreds of nm.

Each of the plurality of fin structures f1 and f2 may include an upper area w1 having a relatively small width and a lower area w2 having a relatively large width, larger than the relatively small width. For example, the upper area w1 of each of the plurality of fin structures f1 and f2 may have a dynamically determined (or, alternatively, predetermined) width in the direction parallel with the first surface 10a (the x-axis direction or the y-axis direction) of the semiconductor substrate 10. The upper area w1 may be adjacent to an area in which the gate electrode layer 30 is provided.

Also, the lower area w2 of each of the plurality of fin structures f1 and f2 may be formed to have a decreasing width away from the semiconductor substrate 10 in an extension direction (the z-axis direction) of the plurality of fin structures f1 and f2. Here, the extension direction (the z-axis direction) thereof may be a direction that is parallel with a direction in which the semiconductor substrate 10, the insulating layer 20, and the gate electrode layer 30 are stacked. The lower area w2 may be adjacent to an area in which the shield layer 40 is provided.

As described above, the upper area w1 of each of the plurality of fin structures f1 and f2, the upper area w1 being adjacent to the gate electrode layer 30, may be formed to have a sufficiently small width, and thus, a depletion area may be formed in the upper area w1 due to fin effects. However, the lower area w2 of each of the plurality of fin structures f1 and f2, the lower area w2 being adjacent to the shield layer 40, may be formed to have a sufficiently large width, and thus, there may be no or reduced fin effects, and the depletion area may not be formed or may only be partially formed in the lower area w2.

The insulating layer 20 may be provided on the first surface 10a of the semiconductor substrate 10 to fill at least a portion of the plurality of trenches T1 and T2. For example, the insulating layer 20 may be provided to fill at least a portion of the plurality of spaces A1, A2, and A3 between the plurality of fin structures f1 and f2. The insulating layer 20 may be provided to cover an area of the first surface 10a, in which the plurality of fin structures f1 and f2 are not formed. For example, the insulating layer 20 may be provided to fill at least a portion of the plurality of trenches T1 and T2 and may be provided to surround a side surface of the plurality of fin structures f1 and f2. Accordingly, the plurality of fin structures f1 and f2 may be formed to upwardly protrude from the insulating layer 20.

The insulating layer 20 may be provided to insulate the gate electrode layer 30 from the shield layer 40 provided in a space between the plurality of fin structures f1 and f2. For example, the insulating layer 20 may be formed to surround the gate electrode layer 30, and thus, the gate electrode layer 30 may be insulated from the plurality of fin structures f1 and f2 and the shield layer 40. Also, the shield layer 40 may be insulated from the plurality of fin structures f1 and f2 and the gate electrode layer 30.

For example, as illustrated in FIG. 2, the insulating layer 20 may include a first insulating layer 20a, a second insulating layer 20b, and a third insulating layer 20c. There may be more than three, or less than three, insulating layers.

The first insulating layer 20a may be provided on the first surface 10a of the semiconductor substrate 10 to fill at least a portion of the plurality of trenches T1 and T2 and may include a first groove h1 in which the shield layer 40 is arranged.

The second insulating layer 20b may be provided on the first insulating layer 20a and may include a second groove h2 in which the gate electrode layer 30 is arranged.

The third insulating layer 20c may be provided on the second insulating layer 20b and may cover the gate electrode layer 30.

The first insulating layer 20a, the second insulating layer 20b, and the third insulating layer 20c may be formed in different processes and may include different dielectric materials from one another. However, the first through third insulating layers 20a through 20c are not limited thereto. At least two of the first through third insulating layers 20a through 20c may be formed integrally with one another and may include the same dielectric material. Also, areas of the first insulating layer 20a and the second insulating layer 20b, the areas contacting the plurality of fin structures f1 and f2, may be formed in the same process.

A lower edge area E1 of the insulating layer 20, the lower edge area E1 being adjacent to a lower portion of the plurality of fin structures f1 and f2, may be formed to have an increasing width away from the semiconductor substrate 10 in the extension direction (the z-axis direction) of the plurality of fin structures f1 and f2. Here, the extension direction (the z-axis direction) thereof may be the direction that is parallel with the direction in which the semiconductor substrate 10, the insulating layer 20, and the gate electrode layer 30 are stacked.

For example, as illustrated in FIG. 2, the lower edge area E1 of the first insulating layer 20a may have a tapered shape, a width of which increases away from the semiconductor substrate 10 in the extension direction (the z-axis direction) thereof. The lower edge area E1 of the first insulating layer 20a may denote an area from a lower surface of the first insulating layer 20a to a side surface of the first insulating layer 20a, the side surface being at the same height as the shield layer 40.

Due to this tapered shape of the insulating layer 20, when a voltage is applied between the first conductive layer 50 and the second conductive layer 60, the field effect concentration in the lower edge area E1 of the insulating layer 20, the lower edge area E1 being adjacent to a lower edge area of the gate electrode layer 30, may be prevented or reduced in likelihood of and/or impact from occurrence.

The insulating layer 20 may include an insulating material, such as at least one of $SiO_2$, SiN, etc. The insulating layer 20 may include a high dielectric (high-k) material. However, the insulating layer 20 is not limited thereto and may include various types of materials such as various types of dielectric materials.

The gate electrode layer 30 may be provided between the plurality of fin structures f1 and f2 and may be surrounded by the insulating layer 20. For example, the gate electrode layer 30 may be arranged in the second groove h2 included in the second insulating layer 20b and may be covered by the third insulating layer 20c. Accordingly, a lower surface and a side surface of the gate electrode layer 30 may be covered by the second insulating layer 20b, and an upper surface of the gate electrode layer 30 may be covered by the third insulating layer 20c.

For example, the gate electrode layer 30 may include a grid pattern structure provided between the plurality of fin structures f1 and f2. A dynamically determined (or, alternatively, predetermined) space may be formed between the plurality of fin structures f1 and f2 that are two-dimensionally arranged, and the gate electrode layer 30 having the grid pattern structure may be provided in the dynamically determined (or, alternatively, predetermined) space.

For example, the gate electrode layer 30 may include a plurality of first gate electrode elements GLp1 and GLp2 formed to extend in a first direction (an x-axis direction) parallel with the first surface 10a of the semiconductor substrate 10 and arranged to be parallel with each other and a plurality of second gate electrode elements GLv1 and GLv2 formed to extend in a second direction (a y-axis direction) parallel with the first surface 10a of the semiconductor substrate 10 and crossing the first direction (the x-axis direction) and arranged to be parallel with each other. Here, the first direction (the x-axis direction) and the second direction (the y-axis direction) may be orthogonal to each other. Also, the plurality of first gate electrode elements GLp1 and GLp2 may be arranged in parallel with each other in the second direction (the y-axis direction), and the plurality of second gate electrode elements GLv1 and GLv2 may be arranged in parallel with each other in the first direction (the x-axis direction).

The plurality of first gate electrode elements GLp1 and GLp2 and the plurality of second gate electrode elements GLv1 and GLv2 may be formed integrally with each other, e.g. at the same time with one another. For example, the plurality of first gate electrode elements GLp1 and GLp2 and the plurality of second gate electrode elements GLv1 and GLv2 may be provided on the same layer, and the plurality of first gate electrode elements GLp1 and GLp2 and the plurality of second gate electrode elements GLv1 and GLv2 may cross each other on a single layer. However, the plurality of first and second gate electrode elements GLp1 and GLp2 and GLv1 and GLv2 are not limited thereto, and the plurality of first and second gate electrode elements GLp1 and GLp2 and GLv1 and GLv2 may be formed on different layers from each other.

The plurality of first gate electrode elements GLp1 and GLp2 and the plurality of second gate electrode elements GLv1 and GLv2 may be electrically connected to an external voltage source through a second via p2. For example, the first gate electrode element GLp2 may be electrically connected to the external voltage source through the second via p2. Accordingly, the gate electrode layer 30 may be electrically connected to the external voltage source.

The plurality of first gate electrode elements GLp1 and GLp2 and the plurality of second gate electrode elements GLv1 and GLv2 may be provided across a space formed between the plurality of fin structures f1 and f2. Accordingly, a portion of the gate electrode layer 30 may be provided between two adjacent fin structures from among the plurality of fin structures f1 and f2.

The gate electrode layer 30 may include a conductive material. For example, the gate electrode layer 30 may include a conductive material, such as at least one of doped or undoped polysilicon (poly-Si), metal, etc. However, the gate electrode layer 30 is not limited thereto and may include various types of conductive materials.

The shield layer 40 may be provided between the gate electrode layer 30 and the semiconductor substrate 10 and may be surrounded by the insulating layer 20. For example, the shield layer 40 may be arranged in the first groove h1 included in the first insulating layer 20a and may be covered by the second insulating layer 20b. Accordingly, a lower surface and a side surface of the shield layer 40 may be covered by the first insulating layer 20a and an upper surface of the shield layer 40 may be covered by the second insulating layer 20b.

For example, the shield layer 40 may include a grid pattern structure provided between the plurality of fin structures f1 and f2. A plurality of spaces may be formed between the plurality of fin structures f1 and f2 that are two-dimensionally arranged, and the shield layer 40 having the grid pattern structure may be provided in the plurality of spaces.

For example, the shield layer 40 may include a plurality of first shield elements SLp1 and SLp2 formed to extend in the first direction (the x-axis direction) and arranged to be parallel with each other and a plurality of second shield elements SLv1 and SLv2 formed to extend in the second direction (the y-axis direction) and arranged to be parallel with each other. Also, the plurality of first shield elements SLp1 and SLp2 may be arranged in parallel with each other in the second direction (the y-axis direction), and the plurality of second shield elements SLv1 and SLv2 may be arranged in parallel with each other in the first direction (the x-axis direction).

The plurality of first shield elements SLp1 and SLp2 may be below the plurality of first gate electrode elements GLp1 and GLp2, respectively. Also, the plurality of second shield elements SLv1 and SLv2 may be below the plurality of second gate electrode elements GLv1 and GLv2, respectively.

A width L1 of the plurality of second shield elements SLv1 and SLv2 in the first direction (the x-axis direction) may be less than or equal to a width L2 of the plurality of second gate electrodes GLv1 and GLv2 in the first direction (the x-axis direction). Similarly, a width in of the plurality of first shield elements SLp1 and SLp2 in the second direction (the y-axis direction) may be less than or equal to a width of the plurality of first gate electrode elements GLp1 and GLp2 in the second direction (the y-axis direction). Accordingly, as illustrated in FIG. 1, downwardly looking at the semiconductor device 100, the shield layer 40 having the grid pattern may be covered, e.g. completely covered by the gate electrode layer 30 having the grid pattern provided above the shield layer 40 having the grid pattern.

The plurality of first shield elements SLp1 and SLp2 and the plurality of second shield elements SLv1 and SLv2 may be formed integrally with each other.

For example, the plurality of first shield elements SLp1 and SLp2 and the plurality of second shield elements SLv1 and SLv2 may be provided on the same layer, and the plurality of first shield elements SLp1 and SLp2 and the plurality of second shield elements SLv1 and SLv2 may cross each other on a single layer. However, the plurality of first and second shield elements SLp1 and SLp2 and SLv1 and SLv2 are not limited thereto, and the plurality of first and second shield elements SLp1 and SLp2 and SLv1 and SLv2 may be formed on different layers from each other.

The shield layer 40 may be electrically connected to the first conductive layer 50. For example, the first shield element SLp1 may be electrically connected to the first conductive layer 50 through a first via p1. Accordingly, the shield layer 40 may be short-circuited with the first conductive layer 50. For example, when a dynamically determined (or, alternatively, predetermined) first voltage is applied to the first conductive layer 50, the first voltage, which is the same voltage as the voltage applied to the first conductive layer 50, may be applied to the shield layer 40, and thus, the first conductive layer 50 and the shield layer 40 may have the same potential.

The plurality of first shield elements SLp1 and SLp2 and the plurality of second shield elements SLv1 and SLv2 may be provided across a space formed between the plurality of fin structures f1 and f2. Accordingly, a portion of the shield layer 40 may be provided between two adjacent fin structures from among the plurality of fin structures f1 and f2.

The shield layer 40 may include a conductive material. For example, the shield layer 40 may include a conductive material, such as at least one of doped poly-Si, metal, etc. However, the shield layer 40 is not limited thereto and may include various types of conductive materials.

The first conductive layer 50 may function as a common source electrode contacting the plurality of fin structures f1 and f2. The first conductive layer 50 may be formed to cover the plurality of fin structures f1 and f2 and the insulating layer 20. For example, the plurality of fin structures f1 and f2 may be formed to upwardly protrude from the insulating layer 20, and the first conductive layer 50 may be formed to surround a side surface of a portion of the plurality of fin structures f1 and f2, the portion protruding from the insulating layer 20.

The first conductive layer 50 may include a conductive material. For example, the first conductive layer 50 may include a conductive material, such as poly-Si, metal, etc. However, the first conductive layer 50 is not limited thereto and may include various types of conductive materials.

The second conductive layer 60 may function as a common drain electrode with respect to the plurality of fin structures f1 and f2. The second conductive layer 60 may be provided on the second surface 10b of the semiconductor substrate 10. The second conductive layer 60 may include a conductive material. For example, the second conductive layer 60 may include a conductive material, such as at least one of poly-Si, metal, etc. However, the second conductive layer 60 is not limited thereto and may include various types of conductive materials.

To improve the power switching efficiency of the semiconductor device 100, a ratio Cgs/Cgd of a gate-source capacitance Cgs to a gate-drain capacitance Cgd may be, e.g. may be desired to be or have to be sufficiently large. For example, the ratio Cgs/Cgd of the gate-source capacitance Cgs to the gate-drain capacitance Cgd may have to be equal to or greater than 5.

As illustrated in FIG. 2, when the first conductive layer 50 functions as a source electrode layer, and the second conductive layer 60 functions as a drain electrode layer, the gate-drain capacitance Cgd of the semiconductor device 100 may be Cgd1, and the gate-source capacitance Cgs may be Cgs1+Cgs2+Cgs3. Here, Cgs3 is a capacitance between the shield layer 40 electrically connected to the first conductive layer 50, and the gate electrode layer 30. In this case, the ratio Cgs/Cgd of the gate-source capacitance Cgs to the gate-drain capacitance Cgd of the semiconductor device 100 may be (Cgs1+Cgs2+Cgs3)/Cgd1.

Referring to FIG. 3, the semiconductor device 101 according to a comparative example may include the semiconductor substrate 10, a plurality of fin structures f3 and f4, an insulating layer 21, the gate electrode layer 30, the first conductive layer 50, and the second conductive layer 60.

Unlike the semiconductor device 100 of FIGS. 1 and 2, the semiconductor device 101 of FIG. 3 may not include the shield layer 40. Also, unlike the insulating layer 20 illustrated in FIG. 2, the insulating layer 21 included in the semiconductor device 101 may include a first insulating layer 21a including a groove in which the gate electrode layer 30 is provided and a second insulating layer 21b covering the gate electrode layer 30.

Because the semiconductor device 101 does not include the shield layer 40, the semiconductor device 101 may have no or limited capacitance between the shield layer 40 and the gate electrode layer 30.

When the first conductive layer 50 functions as a source electrode layer, and the second conductive layer 60 functions as a drain electrode layer, the gate-drain capacitance Cgd of the semiconductor device 101 may be Cgd1+Cgd2, and the gate-source capacitance Cgs may be Cgs1+Cgs2. In this case, the ratio Cgs/Cgd of the gate-source capacitance Cgs to the gate-drain capacitance Cgd of the semiconductor device 101 may be (Cgs1+Cgs2)/(Cgd1+Cgd2).

As described above, the ratio Cgs/Cgd of the gate-source capacitance Cgs to the gate-drain capacitance Cgd of the semiconductor device 100 illustrated in FIG. 2 according to some example embodiments may be (Cgs1+Cgs2+Cgs3)/Cgd1, which may be greater than the ratio Cgs/Cgd of the gate-source capacitance Cgs to the gate-drain capacitance Cgd of the semiconductor device 101 according to the comparative embodiment. As described above, the ratio Cgs/Cgd of the gate-source capacitance Cgs to the gate-drain capacitance Cgd of the semiconductor device 100 may be increased, compared to that according to the comparative embodiment, and thus, the semiconductor device 100 may be more reliable and have improved power switching efficiency.

Figure 4:
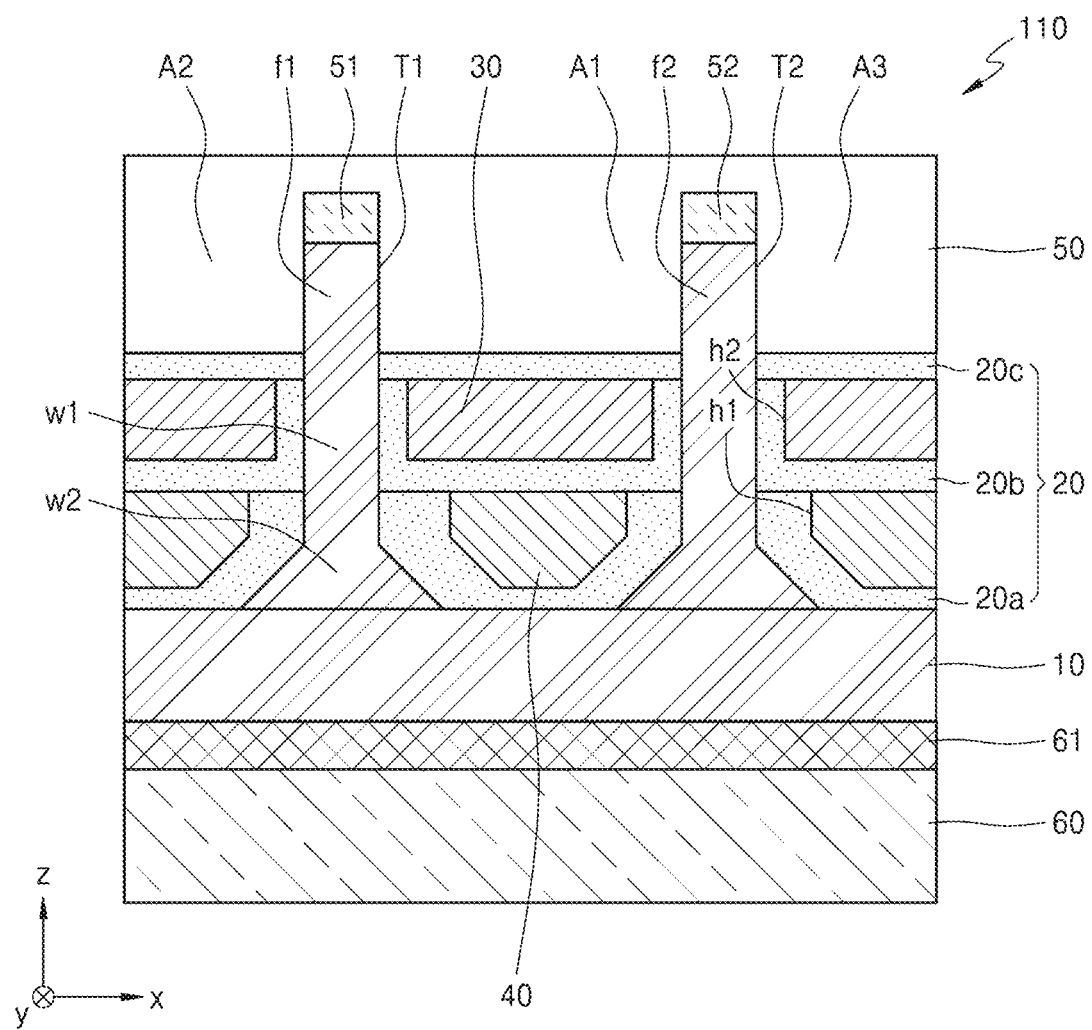
FIG. 4 is a lateral cross-sectional view briefly illustrating an example structure of a semiconductor device according to some example embodiments.

FIG. 4 is a lateral cross-sectional view briefly illustrating an example structure of a semiconductor device 110 according to some example embodiments.

The semiconductor device 110 of FIG. 4 may be substantially the same as the semiconductor device 100 of FIGS. 1 and 2 except that the semiconductor device 110 may further include a plurality of first semiconductor contact layers 51 and 52 and a second semiconductor contact layer 61. When describing FIG. 4, aspects that are the same as the aspects of FIGS. 1 and 2 are omitted.

Referring to FIG. 4, the semiconductor device 110 may include the semiconductor substrate 10, the plurality of fin structures f1 and f2, the insulating layer 20, the gate electrode layer 30, the shield layer 40, the first conductive layer 50, and the second conductive layer 60.

Also, the semiconductor device 110 may further include the plurality of first semiconductor contact layers 51 and 52 provided between the plurality of fin structures f1 and f2 and the first conductive layer 50 and having a doping concentration that is higher than/greater than that of the semiconductor substrate 10. Because the doping concentration of the first semiconductor contact layers 51 and 52 is greater than the doping concentration of the semiconductor substrate 10, an ohmic contact, e.g. a contact having a linear response, may be formed between the first semiconductor contact layers 51 and 52 and the first conductive layer 50.

The plurality of first semiconductor contact layers 51 and 52 may be provided on upper surfaces of the plurality of fin structures f1 and f2, respectively. For example, the first semiconductor contact layer 51 may be provided on the upper surface of the first fin structure f1, and the first semiconductor contact layer 52 may be provided on the upper surface of the second fin structure f2.

For example, the plurality of first semiconductor contact layers 51 and 52 may include GaN. GaN included in the plurality of first semiconductor contact layers 51 and 52 may be n-type GaN. For example, the plurality of first semiconductor contact layers 51 and 52 may include GaN doped with either or both of Si and Ge. However, the plurality of first semiconductor contact layers 51 and 52 are not limited thereto and may include GaN doped with one or more of P, As, and Sb.

The semiconductor device 110 may further include the second semiconductor contact layer 61 provided between the semiconductor substrate 10 and the second conductive layer 60 and having a doping concentration that is higher than that of the semiconductor substrate 10.

Because the doping concentration of the second semiconductor contact layer 61 is higher than the doping concentration of the semiconductor substrate 10, an ohmic contact may be formed between the second semiconductor contact layer 61 and the second conductive layer 60.

For example, the second semiconductor contact layer 61 may include GaN. GaN included in the second semiconductor contact layer 61 may be n-type GaN. For example, the second semiconductor contact layer 61 may include GaN doped with any one of Si and Ge. However, the second semiconductor contact layer 61 is not limited thereto. The second semiconductor contact layer 61 may include GaN doped with any one of P, As, and Sb.

Figure 5:
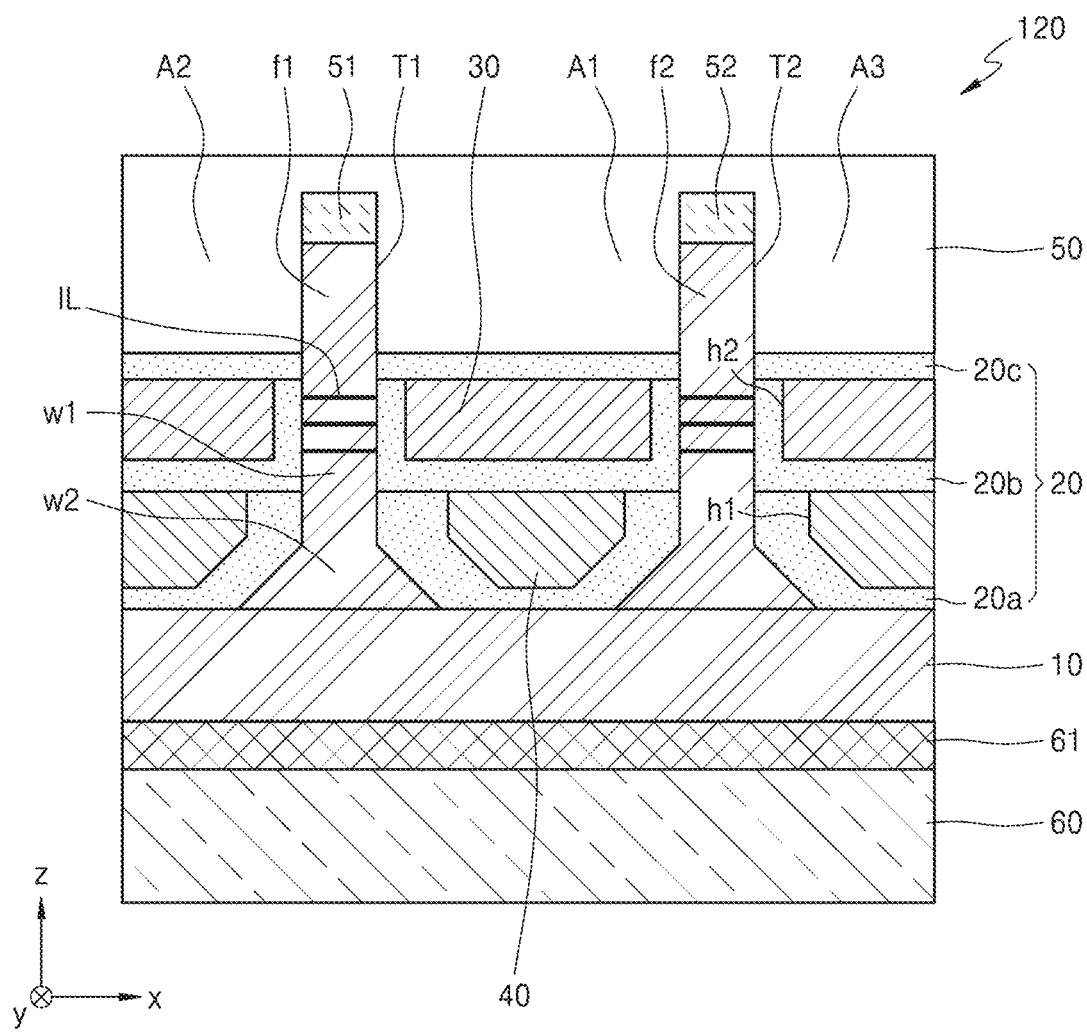
FIG. 5 is a lateral cross-sectional view briefly illustrating an example structure of a semiconductor device according to some example embodiments.

FIG. 5 is a lateral cross-sectional view briefly illustrating an example structure of a semiconductor device 120 according to some example embodiments.

The semiconductor device 120 of FIG. 5 may be substantially the same as the semiconductor device 110 of FIG. 4 except that the semiconductor device 120 may further include one or more inserted semiconductor layers IL. When describing FIG. 5, aspects that are the same as the aspects of FIGS. 1, 2, and 4 are omitted for brevity.

Referring to FIG. 5, the semiconductor device 120 may include the semiconductor substrate 10, the plurality of fin structures f1 and f2, the insulating layer 20, the gate electrode layer 30, the shield layer 40, the first conductive layer 50, the plurality of first semiconductor contact layers 51 and 52, the second conductive layer 60, and the second semiconductor contact layer 61.

The semiconductor device 120 may further include the one or more inserted semiconductor layers IL embedded in an area of each of the plurality of fin structures f1 and f2, the area being adjacent to the gate electrode layer 30. FIG. 5 illustrates that the one or more inserted semiconductor layers IL have a thin film shape. However, the one or more inserted semiconductor layers IL are not limited thereto and may include a plate structure having a dynamically determined (or, alternatively, predetermined) thickness. For example, the one or more inserted semiconductor layers IL may be embedded in the area of each of the plurality of fin structures f1 and f2, the area being adjacent to the gate electrode layer 30, with a dynamically determined (or, alternatively, predetermined) distance therebetween in the extension direction (the z-axis direction) of the plurality of fin structures f1 and f2. FIG. 5 illustrates three inserted semiconductor layers IL. However, the number of inserted semiconductor layers IL is not limited thereto and may be appropriately selected.

The one or more inserted semiconductor layers IL may include a second semiconductor material that is different from the first semiconductor material included in the semiconductor substrate 10. The one or more semiconductor insertion layers IL may include p-type GaN. For example, the one or more semiconductor insertion layers IL may include GaN doped with one or more of Mg and Ca. However, the one or more semiconductor insertion layers IL are not limited thereto and may include GaN doped with one or more of B, Al, and Ga.

When the one or more inserted semiconductor layers IL are embedded in each of the plurality of fin structures f1 and f2, even though each of the plurality of fin structures f1 and f2 has a larger width, the same fin effects as the plurality of fin structures f1 and f2 each having a smaller width and not including the one or more inserted semiconductor layers IL may occur. Thus, when the one or more inserted semiconductor layers IL are provided, the difficulty of a manufacturing process of the plurality of fin structures f1 and f2 may be reduced.

Alternatively or additionally, because the one or more inserted semiconductor layers IL including p-type GaN are embedded in each of the plurality of fin structures f1 and f2, a turn-on speed of the semiconductor device 120 may be increased.

Figure 6:
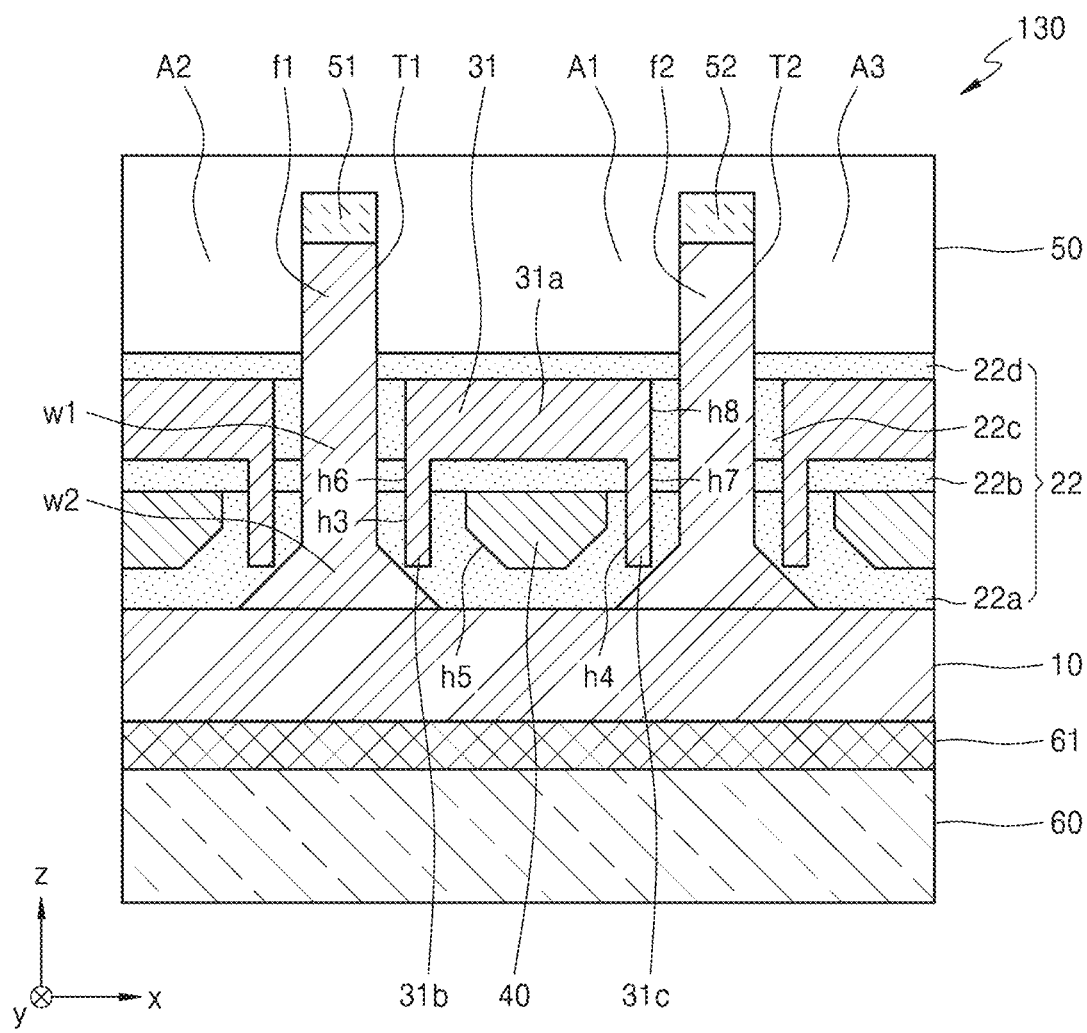
FIG. 6 is a lateral cross-sectional view briefly illustrating an example structure of a semiconductor device according to some example embodiments.

FIG. 6 is a lateral cross-sectional view briefly illustrating an example structure of a semiconductor device 130 according to some example embodiments.

The semiconductor device 130 of FIG. 6 may be substantially the same as the semiconductor device 110 of FIG. 4 except for structures of a gate electrode layer 31 and an insulating layer 22. When describing FIG. 6, aspects that are the same as the aspects of FIGS. 1, 2, and 4 are omitted.

Referring to FIG. 6, the semiconductor device 130 may include the semiconductor substrate 10, the plurality of fin structures f1 and f2, the insulating layer 22, the gate electrode layer 31, the shield layer 40, the first conductive layer 50, the plurality of first semiconductor contact layers 51 and 52, the second conductive layer 60, and the second semiconductor contact layer 61.

The gate electrode layer 31 may include a gate body portion 31a provided on the shield layer 40 and first and second gate protrusion portions 31b and 31c extending downwardly (a −z-axis direction) from an edge of the gate body portion 31a and adjacent to a side surface of the shield layer 40. The gate body portion 31a and the first and second gate protrusion portions 31b and 31c may be formed integrally with one another.

For example, the first gate protrusion portion 31b and the second gate protrusion portion 31c may be provided at both ends of the edge of the gate body portion 31a, respectively. Accordingly, the first and second gate protrusion portions 31b and 31c may be provided between the shield layer 40 and the plurality of fin structures f1 and f2. For example, the first gate protrusion portion 31b may be provided between the fin structure f1 and the shield layer 40 formed in the space A1. Here, when a voltage equal to or greater than a threshold voltage is applied to the gate electrode layer 31, and a voltage is applied between the first conductive layer 50 and the second conductive layer 60, an area of the first fin structure f1, the area being adjacent to the shield layer 40, may have a variable resistance due to the effects of the first gate protrusion portion 31b.

The insulating layer 22 may be provided on the first surface 10a of the semiconductor substrate 10 to fill at least a portion of the plurality of trenches T1 and T2 and may include: a first insulating layer 22a including a first groove h5 in which the shield layer 40 is arranged and second grooves h3 and h4 into which the first and second gate protrusion portions 31b and 31c are inserted; a second insulating layer 22b arranged on the first insulating layer 22a and including through-holes h6 and h7 through which the first and second gate protrusion portions 31b and 31c penetrate; a third insulating layer 22c arranged on the second insulating layer 22b and including a third groove h8 in which the gate body portion 31a is arranged; and a fourth insulating layer 22d arranged on the third insulating layer 22c and covering the gate body portion 31a.

Figure 7:
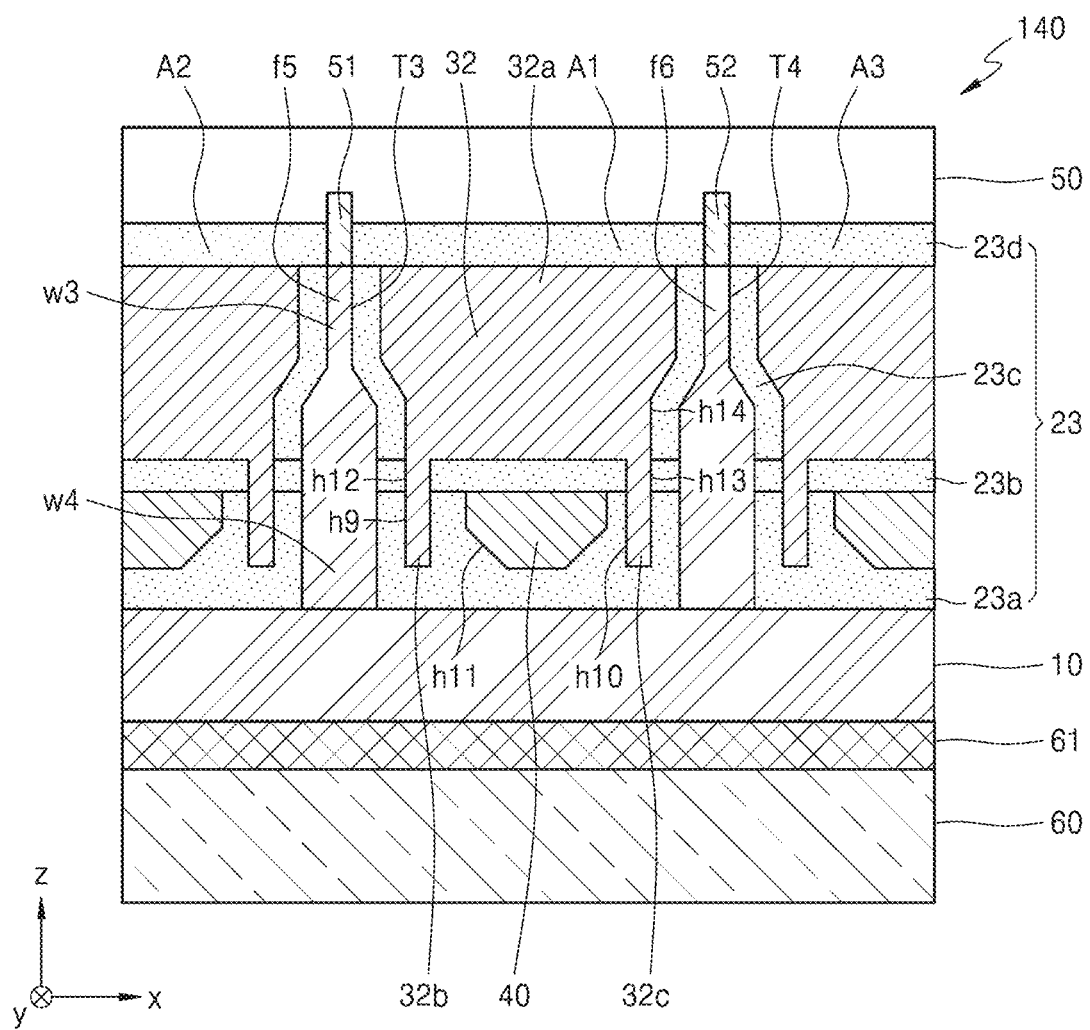
FIG. 7 is a lateral cross-sectional view briefly illustrating an example structure of a semiconductor device according to some example embodiments.

FIG. 7 is a lateral cross-sectional view briefly illustrating an example structure of a semiconductor device 140 according to some example embodiments.

The semiconductor device 140 of FIG. 7 may be substantially the same as the semiconductor device 110 of FIG. 4 except for structures of a gate electrode layer 32, an insulating layer 23, and a plurality of fin structures f5 and f6. When describing FIG. 7, aspects that are the same as the aspects of FIGS. 1, 2, and 4 are omitted.

Referring to FIG. 7, the semiconductor device 140 may include the semiconductor substrate 10, the plurality of fin structures f5 and f5, the insulating layer 23, the gate electrode layer 32, the shield layer 40, the first conductive layer 50, the plurality of first semiconductor contact layers 51 and 52, the second conductive layer 60, and the second semiconductor contact layer 61.

The gate electrode layer 32 may include a gate body portion 32a provided on the shield layer 40 and first and second gate protrusion portions 32b and 32c extending downwardly (a −z-axis direction) from an edge of the gate body portion 32a and adjacent to a side surface of the shield layer 40. The gate body portion 32a and the first and second gate protrusion portions 32b and 32c may be integrally formed with one another.

For example, the first gate protrusion portion 32b and the second gate protrusion portion 32c may be provided at both ends of the edge of the gate body portion 32a, respectively. Accordingly, the first and second gate protrusion portions 32b and 32c may be provided between the shield layer 40 and the plurality of fin structures f5 and f6. For example, the first gate protrusion portion 32b may be provided between the fin structure f5 and the shield layer 40 formed in the space A1. Here, when a voltage greater than or equal to a threshold voltage is applied to the gate electrode layer 32, and a voltage is applied between the first conductive layer 50 and the second conductive layer 60, an area of the fin structure f5, the area being adjacent to the shield layer 40, may have a variable resistance due to the effects of the first gate protrusion portion 32b.

The insulating layer 23 may be provided on the first surface 10a of the semiconductor substrate 10 to fill at least a portion of a plurality of trenches T3 and T4 and may include: a first insulating layer 23a including a first groove h11 in which the shield layer 40 is arranged and second grooves h9 and h10 into which the first and second gate protrusion portions 32b and 32c are inserted; a second insulating layer 23b arranged on the first insulating layer 23a and including through-holes h12 and h13 through which the first and second gate protrusion portions 32b and 32c penetrate; a third insulating layer 23c arranged on the second insulating layer 23b and including a third groove h14 in which the gate body portion 32a is arranged; and a fourth insulating layer 23d arranged on the third insulating layer 23c and covering the gate body portion 32a.

FIG. 7 illustrates that the first insulating layer 23a, the second insulating layer 23b, the third insulating layer 23c, and the fourth insulating layer 23d are separate layers. However, the first through fourth insulating layers 23a through 23d are not limited thereto. For example, the first through fourth insulating layers 23a through 23d may be integrally formed with one another.

Each of the plurality of fin structures f5 and f6 may include an upper area w3 having a relatively small width and a lower area w4 having a relatively large width. For example, the upper area w3 of each of the plurality of fin structures f5 and f6 may have a dynamically determined (or, alternatively, predetermined) width in a direction (an x-axis direction or a y-axis direction) that is parallel with an upper surface of the semiconductor substrate 10. The upper area w3 may be adjacent to an area in which the gate body portion 32a is provided.

Also, for example, the lower area w4 of each of the plurality of fin structures f5 and f6 may have a dynamically determined (or, alternatively, predetermined) width in the direction (the x-axis direction or the y-axis direction) that is parallel with the upper surface of the semiconductor substrate 10, the dynamically determined (or, alternatively, predetermined) width being greater than the dynamically determined (or, alternatively, predetermined) width of the upper area w3 of each of the plurality of fin structures f5 and f6.

The upper area w3 and the lower area w4 may be connected to through a tapered shape, with a width of the tapered shape decreasing away from the semiconductor substrate 10 in an extension direction (a z-axis direction). Here, the extension direction (the z-axis direction) thereof may be a direction that is parallel with a direction in which the semiconductor substrate 10, the insulating layer 23, and the gate electrode layer 32 are stacked. The lower area w4 may be adjacent to an area in which the shield layer 40 is provided.

An upper surface of the plurality of fin structures f5 and f6 and an upper surface of the gate electrode 32 may be at the same height. For example, the upper surface of the plurality of fin structures f5 and f6 may be formed to be coplanar with the upper surface of the gate electrode layer 32. In this case, the plurality of fin structures f5 and f6 may not protrude from the insulating layer 23.

As illustrated in FIG. 7, the insulating layer 23 may be provided to fill most portions of the plurality of trenches T3 and T4, and the first semiconductor contact layers 51 and 52 may upwardly protrude from the insulating layer 23. However, the first semiconductor contact layers 51 and 52 are not limited thereto. An upper surface of the first semiconductor contact layers 51 and 52 may be formed to be coplanar with an upper surface of the fourth insulating layer 23d, and thus, the first semiconductor contact layers 51 and 52 may not protrude from the insulating layer 23.

Figure 8:
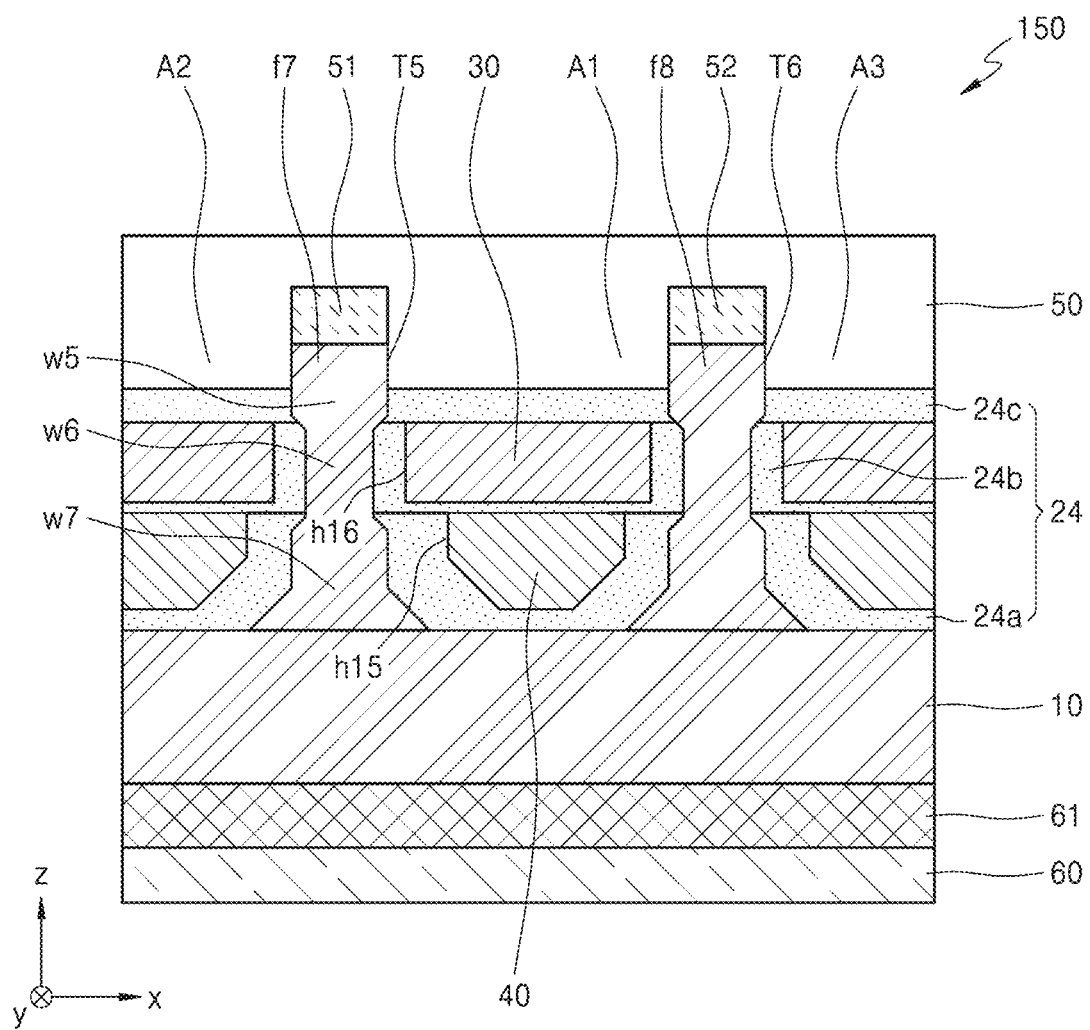
FIG. 8 is a lateral cross-sectional view briefly illustrating an example structure of a semiconductor device according to some example embodiments.

FIG. 8 is a lateral cross-sectional view briefly illustrating an example structure of a semiconductor device 150 according to some example embodiments.

The semiconductor device 150 of FIG. 8 may be substantially the same as the semiconductor device 110 of FIG. 4 except for structures of an insulating layer 24 and a plurality of fin structures f7 and f8. When describing FIG. 8, aspects that are the same as the aspects of FIGS. 1, 2, and 4 are omitted.

Referring to FIG. 8, the semiconductor device 150 may include the semiconductor substrate 10, the plurality of fin structures f7 and f8, the insulating layer 24, the gate electrode layer 30, the shield layer 40, the first conductive layer 50, the plurality of first semiconductor contact layers 51 and 52, the second conductive layer 60, and the second semiconductor contact layer 61.

Each of the plurality of fin structures f7 and f8 may include an upper area w5 and a lower area w7 having relatively large widths and a middle area w6 arranged between the upper area w5 and the lower area w7 and having a relatively small width. For example, the upper area w5 and the lower area w7 of each of the plurality of fin structures f7 and f8 may have a dynamically determined (or, alternatively, predetermined) width in a direction (an x-axis direction or a y-axis direction) that is parallel with an upper surface of the semiconductor substrate 10.

Also, for example, the middle area w6 of each of the plurality of fin structures f7 and f8 may have a dynamically determined (or, alternatively, predetermined) width in the direction (the x-axis direction or the y-axis direction) that is parallel with the upper surface of the semiconductor substrate 10, the dynamically determined (or, alternatively, predetermined) width being less than the dynamically determined (or, alternatively, predetermined) width of the upper area w5 and the lower area w7 thereof. The middle area w6 may be adjacent to an area in which the gate electrode layer 30 is provided.

The upper area w5 and the middle area w6 may be connected through a tapered shape, a width of the tapered shape increasing away from the semiconductor substrate 10 in an extension direction (a z-axis direction. Also, the lower area w7 and the middle area w6 may be connected through the tapered shape, the width of the tapered shape decreasing away from the semiconductor substrate 10 in the extension direction (the z-axis direction) thereof. Here, the extension direction (the z-axis direction) thereof may be a direction that is parallel with a direction in which the semiconductor substrate 10, the insulating layer 24, and the gate electrode layer 30 are stacked. The lower area w7 may be adjacent to an area in which the shield layer 40 is provided.

The insulating layer 24 may include a first insulating layer 24a, a second insulating layer 24b, and a third insulating layer 24c.

The first insulating layer 24a may be provided on the upper surface of the semiconductor substrate 10 to fill at least a portion of a plurality of trenches T5 and T6 and may include a first groove h15 in which the shield layer 40 is arranged.

The second insulating layer 24b may be provided on the first insulating layer 24a and may include a second groove h16 in which the gate electrode layer 30 is arranged.

The third insulating layer 24c may be provided on the second insulating layer 24b and may cover the gate electrode layer 30.

The first through third insulating layers 24a through 24c may be respectively provided in areas corresponding to the upper area w5, the middle area w6, and the lower area w7 of each of the plurality of fin structures f7 and f8. For example, the first through third insulating layers 24a through 24c may be respectively provided to contact the upper area w5, the middle area w6, and the lower area w7 of each of the plurality of fin structures f7 and f8. Accordingly, the first through third insulating layers 24a through 24c may have different widths from one another according to the widths of the upper area w5, the middle area w6, and the lower area w7.

Figure 9:
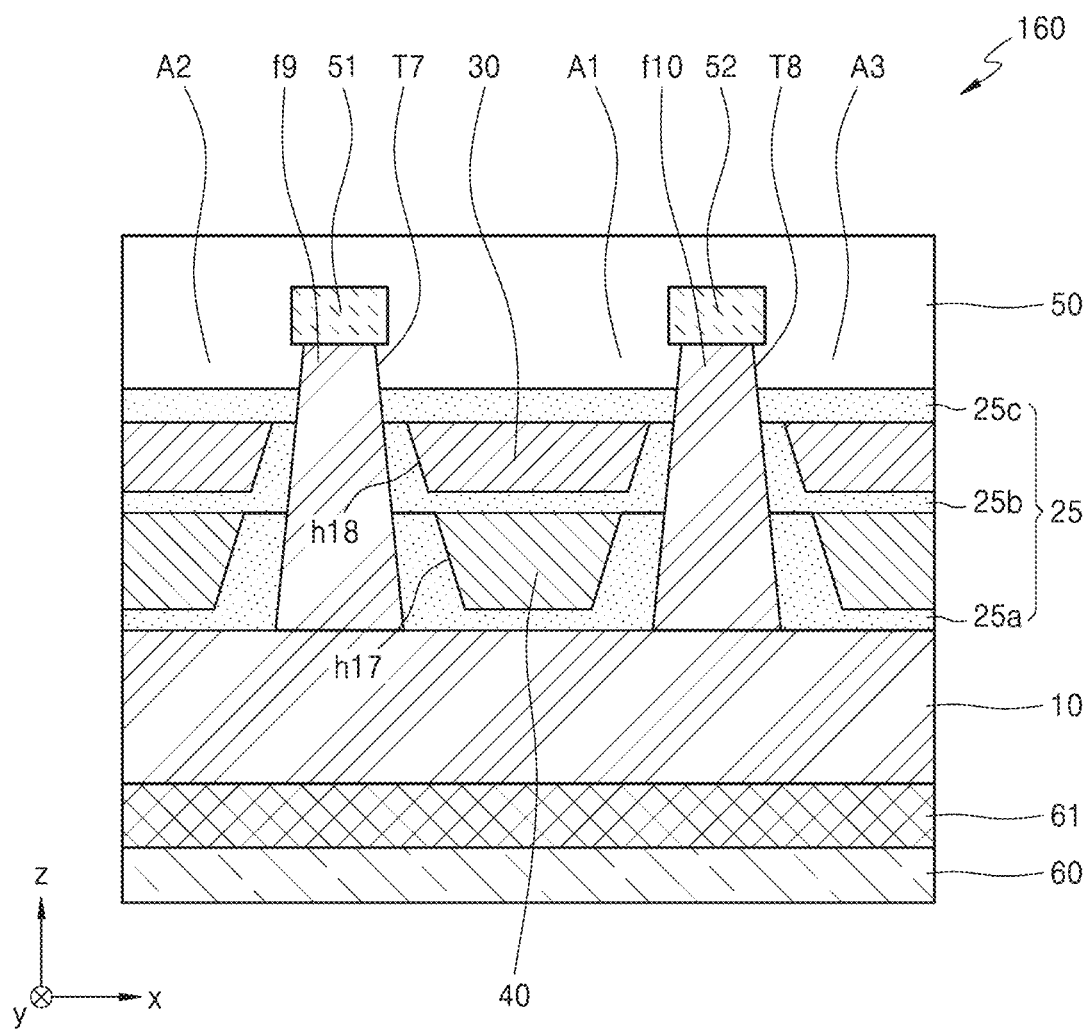
FIG. 9 is a lateral cross-sectional view briefly illustrating an example structure of a semiconductor device according to some example embodiments.

FIG. 9 is a lateral cross-sectional view briefly illustrating an example structure of a semiconductor device 160 according to some example embodiments.

The semiconductor device 160 of FIG. 9 may be substantially the same as the semiconductor device 110 of FIG. 4 except for structures of an insulating layer 25 and a plurality of fin structures f9 and f10. When describing FIG. 9, aspects that are the same as the aspects of FIGS. 1, 2, and 4 are omitted.

Referring to FIG. 9, the semiconductor device 160 may include the semiconductor substrate 10, the plurality of fin structures f9 and f10, the insulating layer 25, the gate electrode layer 30, the shield layer 40, the first conductive layer 50, the plurality of first semiconductor contact layers 51 and 52, the second conductive layer 60, and the second semiconductor contact layer 61.

Each of the plurality of fin structures f9 and f10 may have a tapered shape having an upwardly (a z-axis direction) decreasing width. An area of the plurality of fin structures f9 and f10, with the area being adjacent to the gate electrode layer 30, may have a smaller width than an area of the plurality of fin structures f9 and f10, the area being adjacent to the shield layer 40.

The insulating layer 25 may include a first insulating layer 25a, a second insulating layer 25b, and a third insulating layer 25c.

The first insulating layer 25a may be provided on an upper surface of the semiconductor substrate 10 to fill at least a portion of a plurality of trenches T7 and T8 and may include a first groove h17 in which the shield layer 40 is arranged.

The second insulating layer 25b may be provided on the first insulating layer 25a and may include a second groove h18 in which the gate electrode layer 30 is arranged.

The third insulating layer 25c may be provided on the second insulating layer 25b and may cover the gate electrode layer 30.

Each of the first through third insulating layers 25a through 25c may be formed to contact the plurality of fin structures f9 and f10 each having the tapered shape having the upwardly (the z-axis direction) decreasing width. Accordingly, a width of the first insulating layer 25a may be less than a width of the second insulating layer 25b, and the width of the second insulating layer 25b may be less than a width of the third insulating layer 25c.

Figure 10:
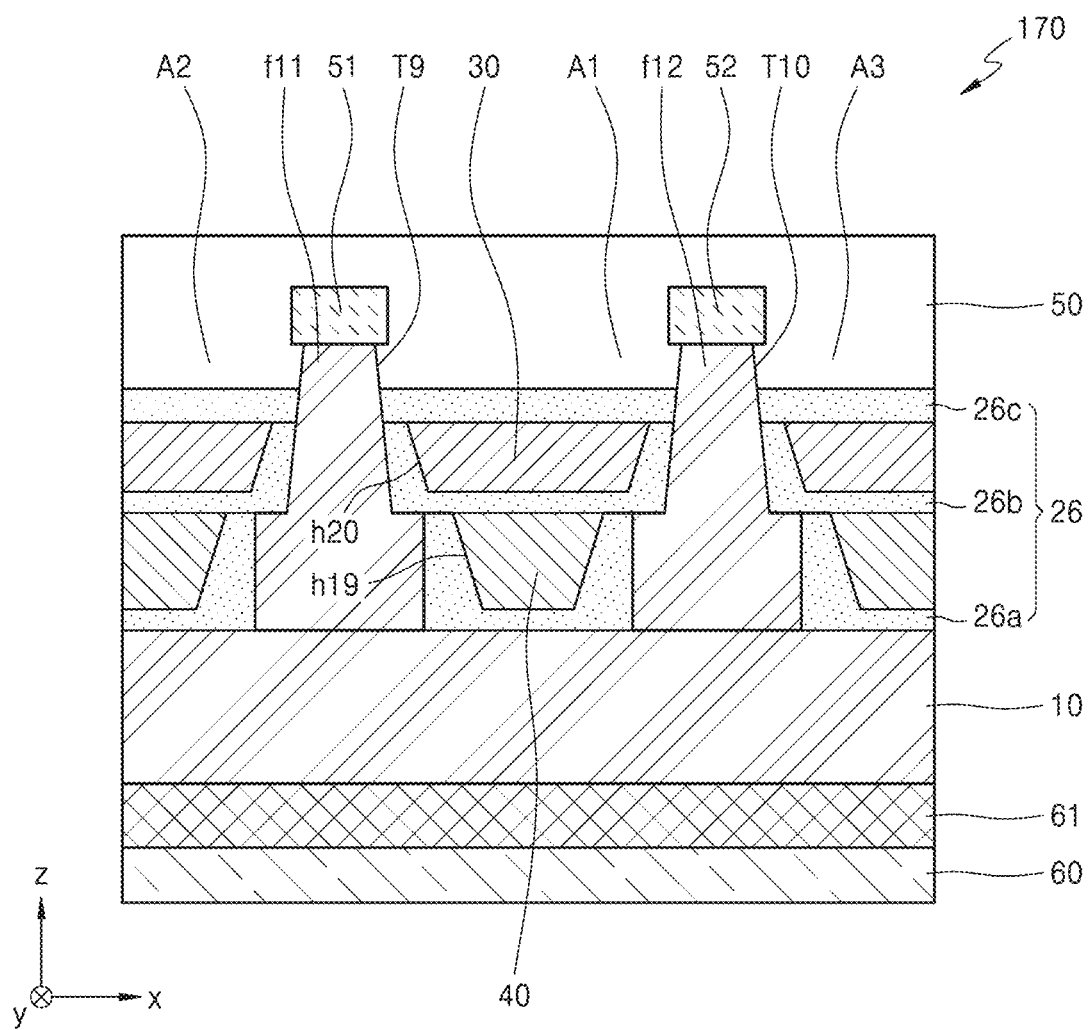
FIG. 10 is a lateral cross-sectional view briefly illustrating an example structure of a semiconductor device according to some example embodiments.

FIG. 10 is a lateral cross-sectional view briefly illustrating an example structure of a semiconductor device 170 according to some example embodiments.

The semiconductor device 170 of FIG. 10 may be substantially the same as the semiconductor device 110 of FIG. 4 except for structures of an insulating layer 26 and a plurality of fin structures f11 and f12. When describing FIG. 10, aspects that are the same as the aspects of FIGS. 1, 2, and 4 are omitted.

Referring to FIG. 10, the semiconductor device 170 may include the semiconductor substrate 10, the plurality of fin structures f11 and f12, the insulating layer 26, the gate electrode layer 30, the shield layer 40, the first conductive layer 50, the plurality of first semiconductor contact layers 51 and 52, the second conductive layer 60, and the second semiconductor contact layer 61.

Each of the plurality of fin structures f11 and f12 may have a stair shape having a relatively small upper width and a relatively large lower width. An area of the plurality of fin structures f11 and f12, the area being adjacent to the gate electrode layer 30, may have a smaller width than an area of the plurality of fin structures f11 and f12, the area being adjacent to the shield layer 40. Alternatively or additionally, an upper portion of each of the plurality of fin structures f11 and f12 may have a tapered shape having an upwardly (a z-axis direction) decreasing width.

The insulating layer 26 may include a first insulating layer 26a, a second insulating layer 26b, and a third insulating layer 26c.

The first insulating layer 26a may be provided on an upper surface of the semiconductor substrate 10 to fill at least a portion of a plurality of trenches T9 and T10 and may include a first groove h19 in which the shield layer 40 is arranged.

The second insulating layer 26b may be provided on the first insulating layer 26a and may include a second groove h20 in which the gate electrode layer 30 is arranged.

The third insulating layer 26c may be provided on the second insulating layer 26b and may cover the gate electrode layer 30.

Each of the first through third insulating layers 26a through 26c may be formed to contact the plurality of fin structures f11 and f12 having the stair shape. Accordingly, a width of the first insulating layer 26a may be less than a width of the second insulating layer 26b.

Alternatively or additionally, the second insulating layer 26b and the third insulating layer 26c may be formed to contact the upper portion of each of the plurality of fin structures f11 and f12, the upper portion having the tapered shape having the upwardly (the z-axis direction) decreasing width. Accordingly, the width of the second insulating layer 26b may be less than a width of the third insulating layer 26c.

Figure 11:
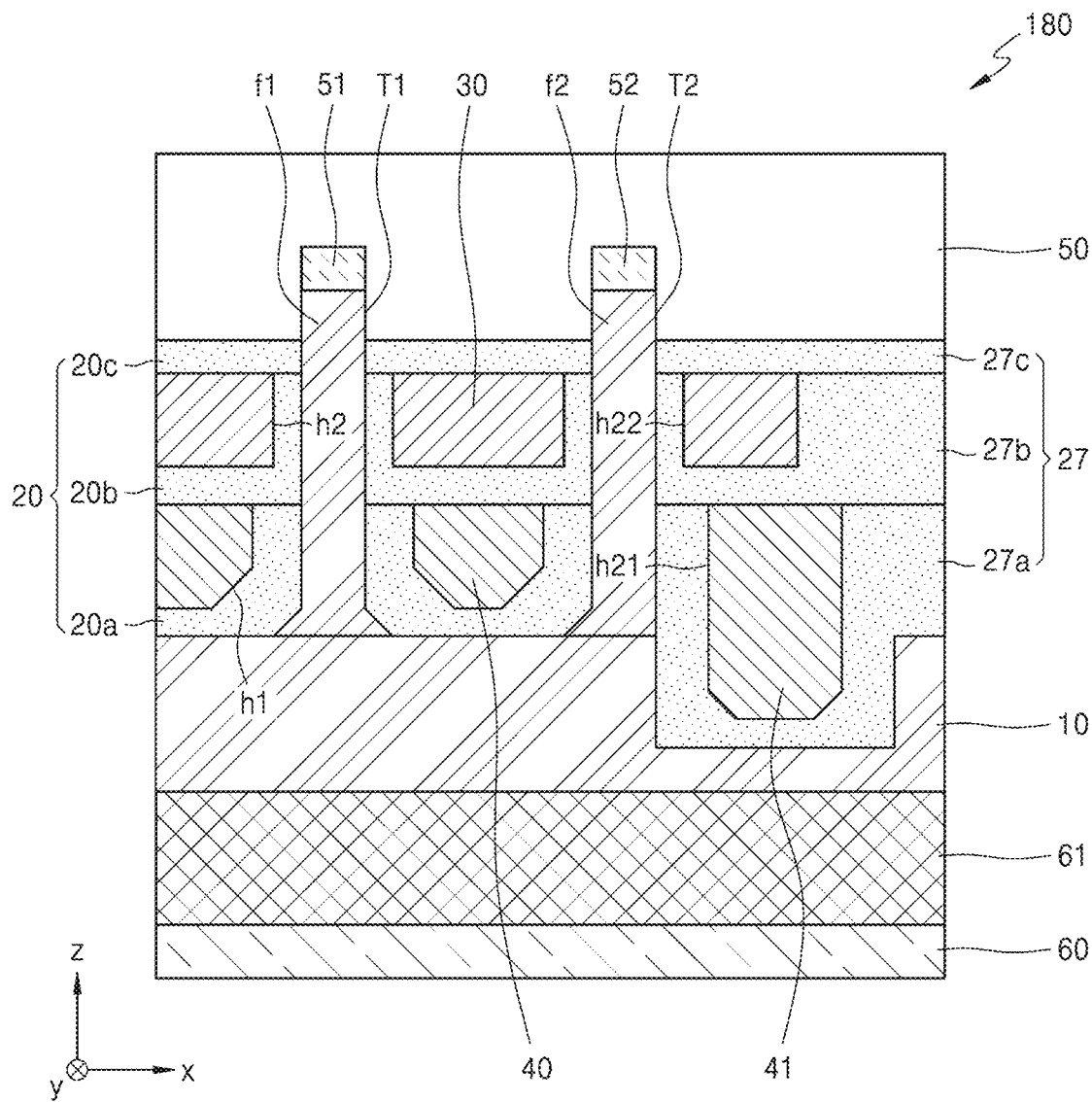
FIG. 11 is a lateral cross-sectional view briefly illustrating an example structure of a semiconductor device according to some example embodiments.

FIG. 11 is a lateral cross-sectional view briefly illustrating an example structure of a semiconductor device 180 according to some example embodiments.

The semiconductor device 180 of FIG. 11 may be substantially the same as the semiconductor device 110 of FIG. 4 except for structures of an outer insulating layer 27 and an outer shield layer 41. When describing FIG. 11, aspects that are the same as the aspects of FIGS. 1, 2, and 4 are omitted.

Referring to FIG. 11, the semiconductor device 180 may include the semiconductor substrate 10, the plurality of fin structures f1 and f2, the insulating layer 20, the outer insulating layer 27, the gate electrode layer 30, the shield layer 40, the outer shield layer 41, the first conductive layer 50, the plurality of first semiconductor contact layers 51 and 52, the second conductive layer 60, and the second semiconductor contact layer 61.

The outer insulating layer 27 may include a first outer insulating layer 27a, a second outer insulating layer 27b, and a third outer insulating layer 27c.

The first outer insulating layer 27a may be provided on an upper surface of the semiconductor substrate 10 to fill at least a portion of the plurality of trenches T1 and T2 and may include a first groove h21 in which the outer shield layer 41 is arranged.

The second outer insulating layer 27b may be provided on the first outer insulating layer 27a and may include a second groove h22 in which the gate electrode layer 30 is arranged.

The third outer insulating layer 27c may be provided on the second outer insulating layer 27b and may cover the gate electrode layer 30.

The outer insulating layer 27 may be inserted into the semiconductor substrate 10 so as to be closer to the second conductive layer 60 compared to the insulating layer 20. Alternatively or additionally, the outer shield layer 41 may be provided in an outer area so as to be more closely adjacent to an edge of the semiconductor substrate 10 compared to the shield layer 40. The outer shield layer 41 may be more deeply inserted into the insulating layer 27 so as to be closer to the second conductive layer 60 compared to the shield layer 40. For example, the first groove h21 may be formed in the first outer insulating layer 27a more deeply than the first groove h1 formed in an inner area of the semiconductor substrate 10. The outer shield layer 41 may be inserted into the first groove h21.

For example, the outer shield layer 41 may be electrically connected to the second conductive layer 60. However, the outer shield layer 41 is not limited thereto and may be electrically connected to the first conductive layer 50.

Accordingly, a length of a current path between the first conductive layer 50 and the second conductive layer 60 may be increased at the edge of the semiconductor device 180, and a leakage current between the first conductive layer 50 and the second conductive layer 60 may be suppressed.

Figure 12:
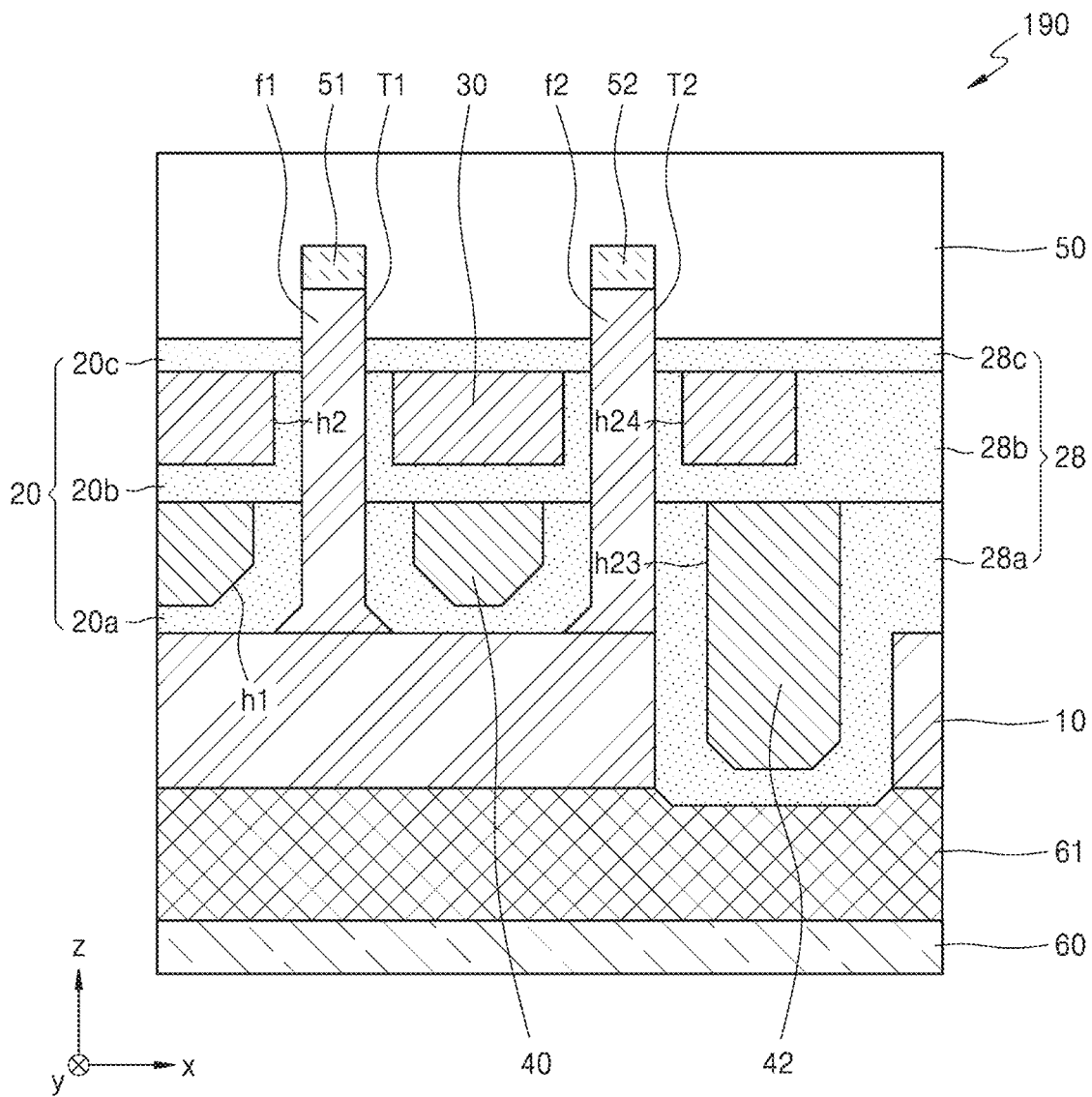
FIG. 12 is a lateral cross-sectional view briefly illustrating an example structure of a semiconductor device according to some example embodiments.

FIG. 12 is a lateral cross-sectional view briefly illustrating an example structure of a semiconductor device 190 according to some example embodiments.

The semiconductor device 190 of FIG. 12 may be substantially the same as the semiconductor device 180 of FIG. 11 except for structures of an outer insulating layer 28 and an outer shield layer 42. When describing FIG. 12, aspects that are the same as the aspects of FIGS. 1, 2, 4, and 11 are omitted.

Referring to FIG. 12, the semiconductor device 190 may include the semiconductor substrate 10, the plurality of fin structures f1 and f2, the insulating layer 20, the outer insulating layer 28, the gate electrode layer 30, the shield layer 40, the outer shield layer 42, the first conductive layer 50, the plurality of first semiconductor contact layers 51 and 52, the second conductive layer 60, and the second semiconductor contact layer 61.

The outer insulating layer 28 may include a first outer insulating layer 28a, a second outer insulating layer 28b, and a third outer insulating layer 28c.

The first outer insulating layer 28a may be provided on an upper surface of the semiconductor substrate 10 to fill at least a portion of the plurality of trenches T1 and T2 and may include a first groove h23 in which the outer shield layer 42 is arranged.

The second outer insulating layer 28b may be provided on the first outer insulating layer 28a and may include a second groove h24 in which the gate electrode layer 30 is arranged.

The third outer insulating layer 28c may be provided on the second outer insulating layer 28b and may cover the gate electrode layer 30.

The outer insulating layer 28 may be inserted into the semiconductor substrate 10 so as to be closer to the second conductive layer 60 compared to the insulating layer 20. Further, the outer insulating layer 28 may penetrate through the semiconductor substrate 10 to be inserted into the second semiconductor contact layer 61.

Alternatively or additionally, the outer shield layer 42 may be provided in an outer area so as to be more closely adjacent to an edge of the semiconductor substrate 10 compared to the shield layer 40. The outer shield layer 42 may be more deeply inserted into the insulating layer 28 so as to be closer to the second conductive layer 60 compared to the shield layer 40. For example, the first groove h23 more deeply formed than the first groove h1 provided in an inner area of the semiconductor substrate 10 may be formed in the first outer insulating layer 28a. The outer shield layer 42 may be inserted into the first groove h23.

For example, the outer shield layer 42 may be electrically connected to the second conductive layer 60. However, the outer shield layer 42 is not limited thereto and may be electrically connected to the first conductive layer 50.

Accordingly, a length of a current path between the first conductive layer 50 and the second conductive layer 60 may be increased at the edge of the semiconductor device 190, and a leakage current between the first conductive layer 50 and the second conductive layer 60 may be suppressed.

Figure 13:
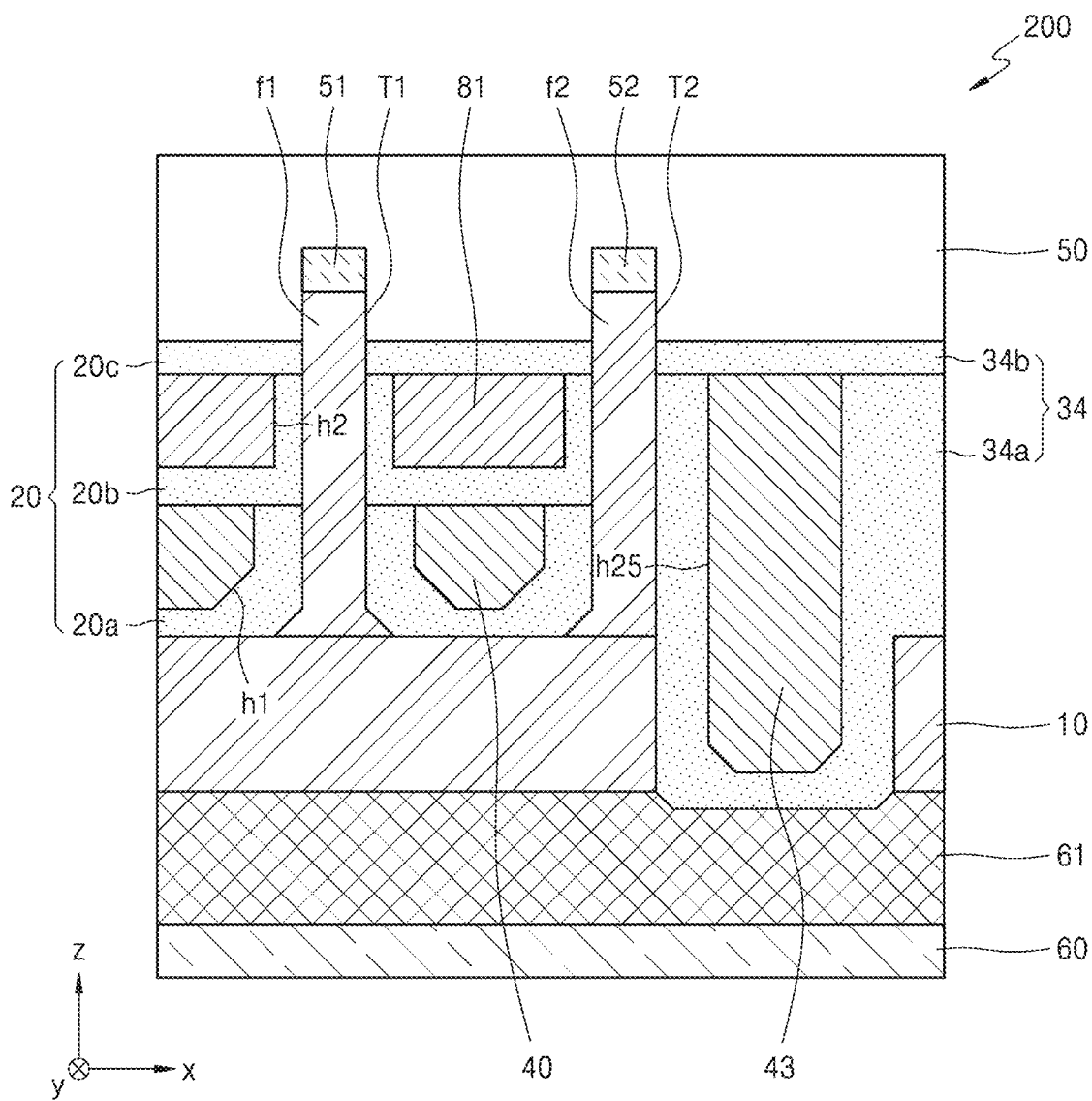
FIG. 13 is a lateral cross-sectional view briefly illustrating an example structure of a semiconductor device according to some example embodiments.

FIG. 13 is a lateral cross-sectional view briefly illustrating an example structure of a semiconductor device 200 according to some example embodiments.

The semiconductor device 200 of FIG. 13 may be substantially the same as the semiconductor device 190 of FIG. 12 except for structures of a gate electrode layer 81, an outer insulating layer 34, and an outer shield layer 43. When describing FIG. 13, aspects that are the same as the aspects of FIGS. 1, 2, 4, and 12 are omitted.

Referring to FIG. 13, the semiconductor device 200 may include the semiconductor substrate 10, the plurality of fin structures f1 and f2, the insulating layer 20, the outer insulating layer 34, the gate electrode layer 81, the shield layer 40, the outer shield layer 43, the first conductive layer 50, the plurality of first semiconductor contact layers 51 and 52, the second conductive layer 60, and the second semiconductor contact layer 61.

The outer insulating layer 34 may include a first outer insulating layer 34a and a second outer insulating layer 34b.

The first outer insulating layer 34a may be provided on an upper surface of the semiconductor substrate 10 to fill at least a portion of the plurality of trenches T1 and T2 and may include a first groove h25 in which the outer shield layer 43 is arranged. The first outer insulating layer 34a may be formed to extend to correspond to an area in which the first insulating layer 20a and the second insulating layer 20b of the insulating layer 20 are formed.

The second outer insulating layer 34b may be provided on the first outer insulating layer 34a and may cover the shield layer 43.

The gate electrode layer 81 may not be provided on the outer insulating layer 34. Alternatively or additionally, the outer insulating layer 34 may be inserted into the semiconductor substrate 10 so as to be closer to the second conductive layer 60 compared to the insulating layer 20. Further, the outer insulating layer 34 may penetrate through the semiconductor substrate 10 to be inserted into the second semiconductor contact layer 61.

Alternatively or additionally, the outer shield layer 43 may be provided in an outer area so as to be more closely adjacent to an edge of the semiconductor substrate 10 compared to the shield layer 40. The outer shield layer 43 may be more deeply inserted into the insulating layer 34 so as to be closer to the second conductive layer 60 compared to the shield layer 40. For example, the first groove h25 more deeply formed than the first groove h1 provided in an inner area of the semiconductor substrate 10 may be formed in the first insulating layer 34a. The first groove h25 may be formed to extend to correspond to an area in which the first insulating layer 20a and the second insulating layer 20b are formed. The outer shield layer 43 may be inserted into the first groove h25.

For example, the outer shield layer 43 may be electrically connected to the second conductive layer 60. However, the outer shield layer 43 is not limited thereto and may be electrically connected to the first conductive layer 50.

Accordingly, a length of a current path between the first conductive layer 50 and the second conductive layer 60 may be increased at the edge of the semiconductor device 200, and a leakage current between the first conductive layer 50 and the second conductive layer 60 may be suppressed.

Figure 14:
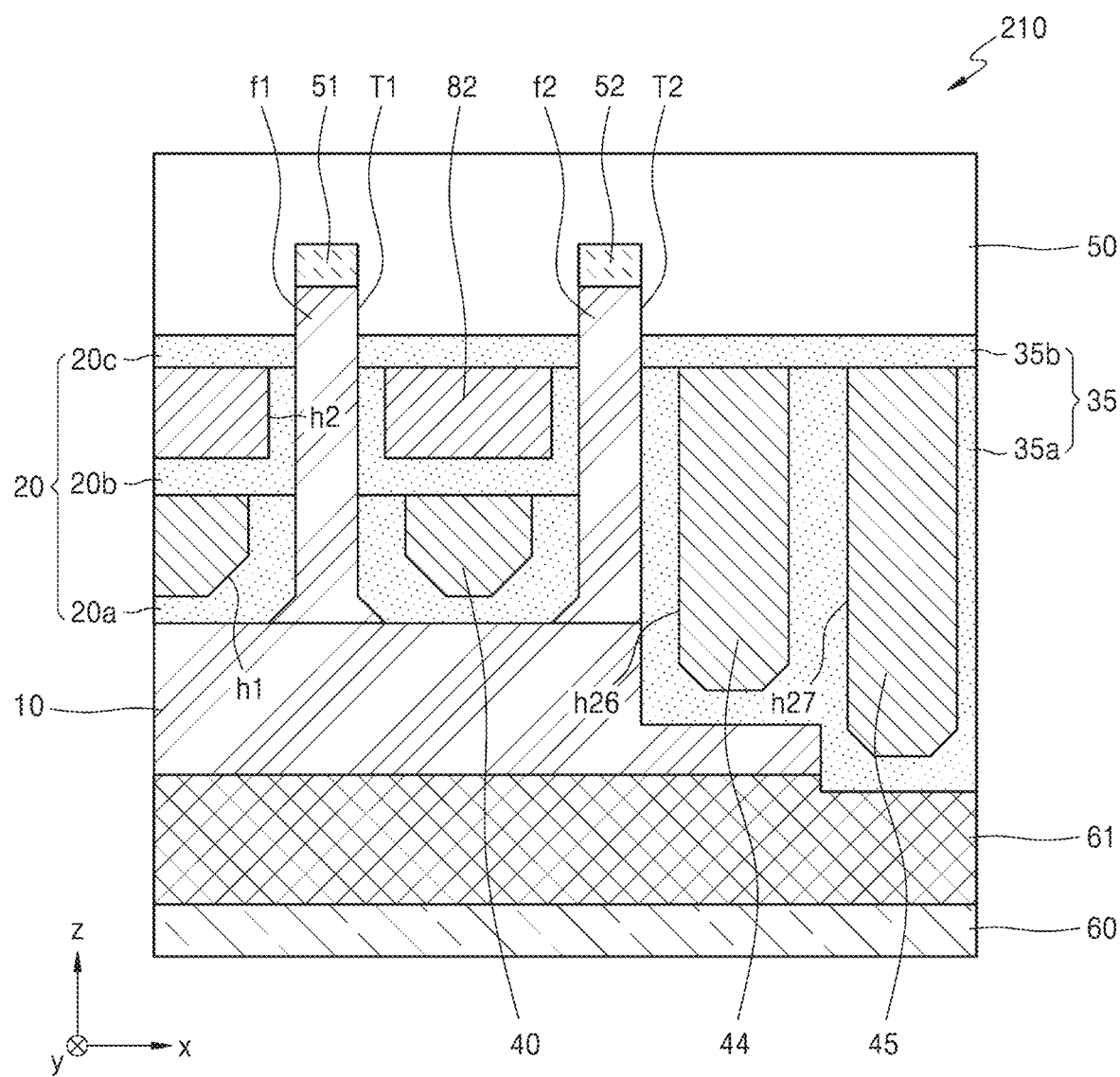
FIG. 14 is a lateral cross-sectional view briefly illustrating an example structure of a semiconductor device according to some example embodiments.

FIG. 14 is a lateral cross-sectional view briefly illustrating an example structure of a semiconductor device 210 according to some example embodiments.

The semiconductor device 210 of FIG. 14 may be substantially the same as the semiconductor device 190 of FIG. 12 except for structures of a gate electrode layer 82, an outer insulating layer 35, and a plurality of outer shield layers 44 and 45. When describing FIG. 14, aspects that are the same as the aspects of FIGS. 1, 2, 4, and 12 are omitted.

Referring to FIG. 14, the semiconductor device 210 may include the semiconductor substrate 10, the plurality of fin structures f1 and f2, the insulating layer 20, the outer insulating layer 35, the gate electrode layer 82, the plurality of outer shield layers 44 and 45, the first conductive layer 50, the plurality of first semiconductor contact layers 51 and 52, the second conductive layer 60, and the second semiconductor contact layer 61.

The outer insulating layer 35 may include a first outer insulating layer 35a and a second outer insulating layer 35b.

The first outer insulating layer 35a may be provided on an upper surface of the semiconductor substrate 10 to fill at least a portion of the plurality of trenches T1 and T2 and may include a plurality of first grooves h26 and h27 in which the plurality of outer shield layers 44 and 45 are arranged, respectively. The first outer insulating layer 35a may be formed to extend to correspond to an area in which the first outer insulating layer 20a and the second insulating layer 20b of the insulating layer 20 are formed.

The second outer insulating layer 35b may be provided on the first outer insulating layer 35a and may cover the plurality of outer shield layers 44 and 45.

The gate electrode layer 82 may not be provided on the outer insulating layer 35. Alternatively or additionally, the outer insulating layer 35 may be inserted into the semiconductor substrate 10 so as to be closer to the second conductive layer 60 compared to the insulating layer 20. Further, at least a portion of the outer insulating layer 35 may penetrate through the semiconductor substrate 10 to be inserted into the second semiconductor contact layer 61.

Alternatively or additionally, the plurality of outer shield layers 44 and 45 may be provided in an outer area so as to be more closely adjacent to an edge of the semiconductor substrate 10 compared to the shield layer 40. The plurality of outer shield layers 44 and 45 may be more deeply inserted into the insulating layer 35 so as to be closer to the second conductive layer 60 compared to the shield layer 40. For example, the plurality of first grooves h26 and h27 more deeply formed than the first groove h1 provided in an inner area of the semiconductor substrate 10 may be formed in the first outer insulating layer 35a. The plurality of first grooves h26 and h27 may be formed to extend throughout an area corresponding to the first insulating layer 20a and the second insulating layer 20b of the insulating layer 20. The plurality of outer shield layers 44 and 45 may be inserted into the plurality of first grooves h26 and h27, respectively. In this case, a depth of the first groove h26 may be different from a depth of the first groove h27.

For example, the plurality of outer shield layers 44 and 45 may be electrically connected to the second conductive layer 60. However, the plurality of outer shield layers 44 and 45 are not limited thereto and may be electrically connected to the first conductive layer 50. Also, the plurality of outer shield layers 44 and 45 may be connected to each other and may be formed integrally with each other. However, the plurality of outer shield layers 44 and 45 are not limited thereto and may be formed as separate structures that are not connected to each other.

Accordingly, a length of a current path between the first conductive layer 50 and the second conductive layer 60 may be increased at the edge of the semiconductor device 210, and a leakage current between the first conductive layer 50 and the second conductive layer 60 may be suppressed.

Figure 15:
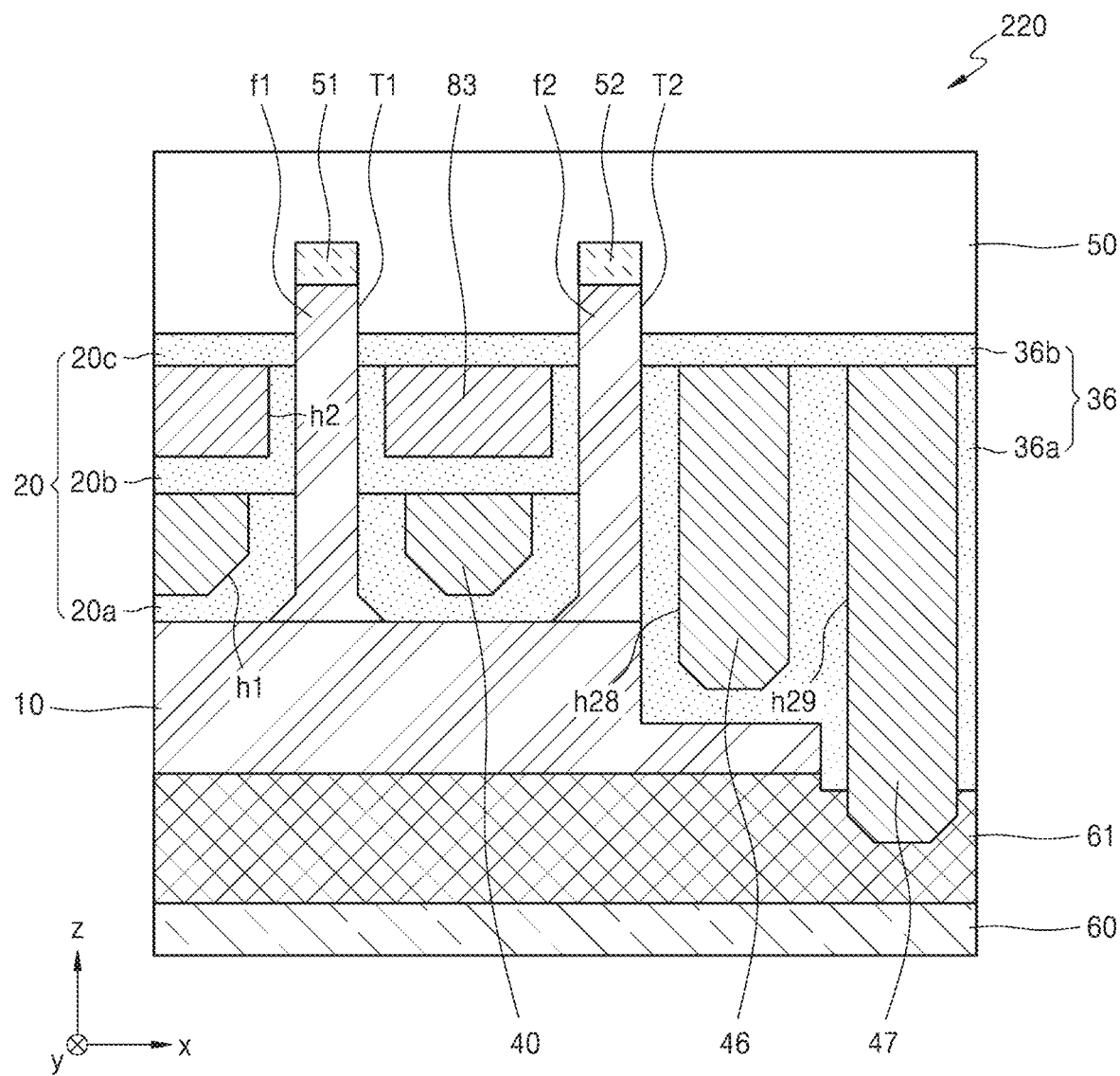
FIG. 15 is a lateral cross-sectional view briefly illustrating an example structure of a semiconductor device according to some example embodiments.

FIG. 15 is a lateral cross-sectional view briefly illustrating an example structure of a semiconductor device 220 according to some example embodiments.

The semiconductor device 220 of FIG. 15 may be substantially the same as the semiconductor device 190 of FIG. 12 except for structures of a gate electrode layer 83, an outer insulating layer 36, and a plurality of outer shield layers 46 and 47. When describing FIG. 15, aspects that are the same as the aspects of FIGS. 1, 2, 4, and 12 are omitted.

Referring to FIG. 15, the semiconductor device 220 may include the semiconductor substrate 10, the plurality of fin structures f1 and f2, the insulating layer 20, the outer insulating layer 36, the gate electrode layer 83, the shield layer 40, the plurality of outer shield layers 46 and 47, the first conductive layer 50, the plurality of first semiconductor contact layers 51 and 52, the second conductive layer 60, and the second semiconductor contact layer 61.

The outer insulating layer 36 may include a first insulating layer 36a and a second insulating layer 36b.

The first insulating layer 36a may be provided on an upper surface of the semiconductor substrate 10 to fill at least a portion of the plurality of trenches T1 and T2 and may include a plurality of first grooves h28 and h29 in which the plurality of outer shield layers 46 and 47 are arranged, respectively.

The second insulating layer 36b may be provided on the first insulating layer 36a and may cover the plurality of outer shield layers 46 and 47.

The gate electrode layer 83 may not be provided on the outer insulating layer 36. Alternatively or additionally, the outer insulating layer 36 may be inserted into the semiconductor substrate 10 so as to be closer to the second conductive layer 60 compared to the insulating layer 20. Further, at least a portion of the outer insulating layer 36 may penetrate through the semiconductor substrate 10 to be inserted into the second semiconductor contact layer 61.

Alternatively or additionally, an area of the plurality of outer shield layers 46 and 47, the area being adjacent to an edge of the semiconductor substrate 10, may be more deeply inserted into the insulating layer 36 to be closer to the second conductive layer 60, than the other area of the plurality of outer shield layers 46 and 47. For example, the plurality of first grooves h28 and h29 more deeply formed than the first groove h1 provided in an inner area of the semiconductor substrate 10 may be formed in the first insulating layer 36a. The plurality of first grooves h28 and h29 may be formed to extend to correspond to an area through which the first insulating layer 20a and the second insulating layer 20b of the insulating layer 20 are formed. The plurality of outer shield layers 46 and 47 may be inserted into the plurality of first grooves h28 and h29, respectively. In this case, a depth of the first groove h28 may be different from a depth of the first groove h29.

For example, the first groove h29 of the first outer insulating layer 36a, the first groove h29 being at the outermost area relatively more adjacent to the edge of the semiconductor substrate 10 than the first groove h28, may even extend to a portion of the second semiconductor contact layer 61. Accordingly, the outer shield layer 47 from among the plurality of outer shield layers 46 and 47, the outer shield layer 47 being arranged in the first groove h29 at the outermost area, may penetrate through the semiconductor substrate 10 through the first groove h29 at the outermost area and may be inserted into the second semiconductor contact layer 61.

For example, the plurality of outer shield layers 46 and 47 may be electrically connected to the second conductive layer 60. However, the plurality of outer shield layers 46 and 47 are not limited thereto and may be electrically connected to the first conductive layer 50. Also, the plurality of outer shield layers 46 and 47 may be connected to each other and may be formed integrally with each other. However, the plurality of outer shield layers 46 and 47 are not limited thereto and may be formed as separate structures that are not connected to each other.

Accordingly, a length of a current path between the first conductive layer 50 and the second conductive layer 60 may be increased at the edge of the semiconductor device 220, and a leakage current between the first conductive layer 50 and the second conductive layer 60 may be partially or fully suppressed.

Figure 16:
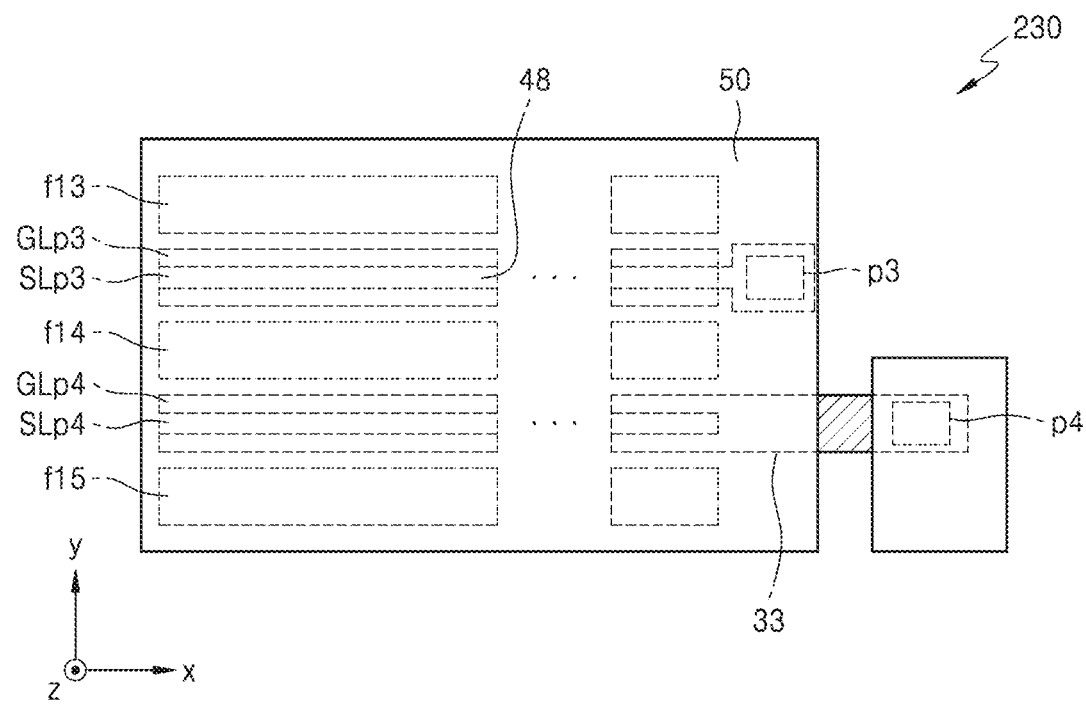
FIG. 16 is a lateral cross-sectional view briefly illustrating an example structure of a semiconductor device according to some example embodiments.

FIG. 16 is a lateral cross-sectional view briefly illustrating an example structure of a semiconductor device 230 according to some example embodiments.

The semiconductor device 230 of FIG. 16 may be substantially the same as the semiconductor device 100 of FIGS. 1 and 2 except for structures of a gate electrode layer 33 and a shield layer 48. When describing FIG. 16, aspects that are the same as the aspects of FIGS. 1 and 2 are omitted. Also, for describing FIG. 16, the structures of FIGS. 1 and 2 are referred to.

A plurality of fin structures f13, f14, and f15 may extend in a first direction (an x-axis direction) that is parallel with the first surface 10a of the semiconductor substrate 10 and may be arranged to be parallel with each other. For example, as illustrated in FIG. 16, each of the plurality of fin structures f13, f14, and f15 may include a line shape extending in the first direction (the x-axis direction). Also, the plurality of fin structures f13, f14, and f15 may be arranged in parallel with each other in a second direction (a y-axis direction).

The gate electrode layer 33 may include a plurality of gate electrode elements GLp3 and GLp4 extending in the first direction (the x-axis direction) and arranged to be parallel with each other. Here, the first direction (the x-axis direction) and the second direction (the y-axis direction) may be orthogonal to each other. The plurality of gate electrode elements GLp3 and GLp4 may be arranged between the plurality of fin structures f13, f14, and f15 to be parallel with the plurality of fin structures f13, f14, and f15. For example, the plurality of gate electrode elements GLp3 and GLp4 may be arranged in parallel with each other in the second direction (the y-axis direction).

The plurality of gate electrode elements GLp3 and GLp4 may be formed integrally with each other. For example, the plurality of gate electrode elements GLp3 and GLp4 may be connected to each other through a connection element (not shown) and may be formed integrally with each other.

The plurality of gate electrode elements GLp3 and GLp4 may be electrically connected to an external voltage source through a second via p4. For example, the gate electrode element GLp4 may be electrically connected to the external voltage source through the second via p4. Accordingly, the gate electrode layer 33 may be electrically connected to the external voltage source.

The shield layer 48 may include a plurality of shield elements SLp3 and SLp4 extending in the first direction (the x-axis direction) and arranged to be parallel with each other. The plurality of shield elements SLp3 and SLp4 may be arranged between the plurality of fin structures f13, f14, and f15 to be parallel with the plurality of fin structures f13, f14, and f15. For example, the plurality of shield elements SLp3 and SLp4 may be arranged in parallel with each other in the second direction (the y-axis direction).

The plurality of first shield elements SLp3 and SLp4 may be below the plurality of gate electrode elements GLp3 and GLp4, respectively.

The plurality of shield elements SLp3 and SLp4 may be formed integrally with each other. For example, the plurality of shield elements SLp3 and SLp4 may be connected to each other through a connection element (not shown) and may be formed integrally with each other.

The shield layer 48 may be electrically connected to the first conductive layer 50. For example, the first shield element SLp3 may be electrically connected to the first conductive layer 50 through a first via p3. Accordingly, the shield layer 48 may be short-circuited with the first conductive layer 50.

Figure 17:
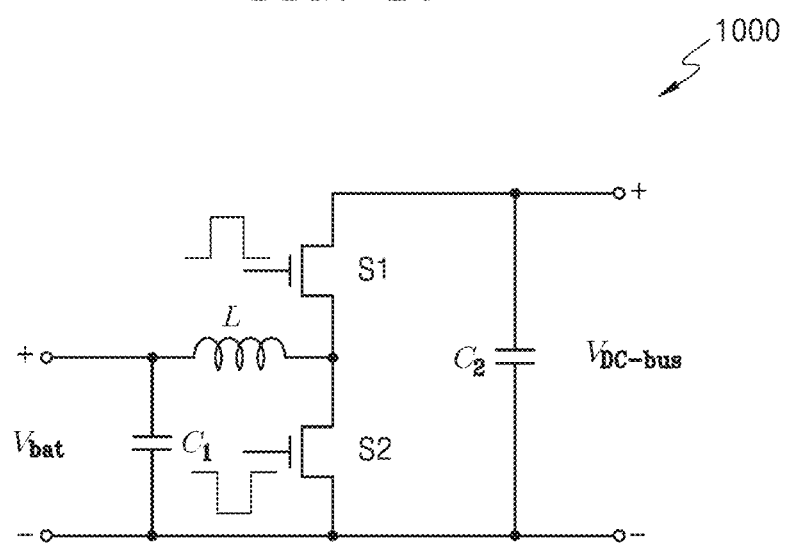
FIG. 17 is a circuit diagram briefly illustrating an example structure of a power switching system according to some example embodiments.

FIG. 17 is a circuit diagram briefly illustrating an example structure of a power switching system 1000 according to some example embodiments.

Referring to FIG. 17, the power switching system 1000 may include a circuit in which at least two switching devices S1 and S2 and various types of passive devices L, C1, and C2 are appropriately arranged.

Each of the at least two switching devices S1 and S2 may include any one of the semiconductor devices 100 through 230 described with reference to FIGS. 1 through 16 according to various embodiments.

The at least two switching devices S1 and S2 may have a sufficiently large ratio $C_{gs}/C_{gd}$ of a gate-source capacitance $C_{gs}$ to a gate-drain capacitance $C_{gd}$, and thus, the power switching efficiency may be improved. Accordingly, the power switching efficiency of the power switching system 1000 may be improved.

As described above, according to one or more of example embodiments, the semiconductor device including the shield layer between the gate electrode layer and the drain electrode layer to have a decreased capacitance between the gate electrode layer and the drain electrode layer, and the power switching system including the semiconductor device may be provided.

As described above, according to one or more example embodiments, the semiconductor device including the shield layer may have an improved switching speed.

As described above, according to one or more of example embodiments, the semiconductor device including a tapered shape of a lower edge area of the insulating layer surrounding the gate electrode layer and the shield layer for distributing field effects which may be concentrated in the gate electrode layer, thereby having an improved efficiency, and the power switching system including the semiconductor device may be provided.

It should be understood that example embodiments described herein should be considered in a descriptive sense only and not for purposes of limitation. Descriptions of features or aspects within each embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims.

What is claimed is:

1. A semiconductor device comprising:
a semiconductor substrate including a first surface and a second surface facing each other, the semiconductor substrate including a first semiconductor material;
a plurality of fin structures upwardly extending on the first surface of the semiconductor substrate, the plurality of fin structures spaced apart from each other by a plurality of trenches, and the plurality of fin structures including the first semiconductor material as the semiconductor substrate, wherein
   each of the plurality of fin structures includes a lower portion on the first surface of the semiconductor substrate and an upper portion on the lower portion, and
   an angle of taper between the first surface of the semiconductor substrate and the lower portion is different than an angle of taper between the lower portion and the upper portion;
an insulating layer on the first surface of the semiconductor substrate and filling at least a portion of the plurality of trenches;
a gate electrode layer between the plurality of fin structures and surrounded by the insulating layer;
a first conductive layer covering the plurality of fin structures and the insulating layer;
a second conductive layer on the second surface of the semiconductor substrate;
a shield layer between the gate electrode layer and the semiconductor substrate, the shield layer surrounded by the insulating layer on side and bottom surfaces of the shield layer; and
the shield layer being electrically connected to the first conductive layer,
wherein the plurality of fin structures upwardly protrude from the insulating layer, and the first conductive layer surrounds a side surface of an upper portion of the plurality of fin structures, the upper portion protruding from the insulating layer, and
the upper portion protruding from the insulating layer has a same doping concentration as a doping concentration of the semiconductor substrate.

2. The semiconductor device of claim 1,
wherein the plurality of fin structures include a plurality of pillar shapes two-dimensionally arranged on the first surface of the semiconductor substrate.

3. The semiconductor device of claim 2,
wherein the gate electrode layer includes a gate electrode grid pattern structure in a first space between the plurality of fin structures, and
the shield layer includes a shield layer grid pattern structure in a second space between the plurality of fin structures.

4. The semiconductor device of claim 2,
wherein the gate electrode layer includes a plurality of first gate electrode elements, which are arranged in parallel with each other and extend in a first direction parallel with the first surface of the semiconductor substrate, and a plurality of second gate electrode elements, which arranged in parallel with each other and extend in a second direction parallel with the first surface and crossing the first direction, and
the shield layer includes a plurality of first shield elements, which are arranged in parallel with each other and extend in the first direction, and a plurality of second shield elements, which are arranged in parallel with each other and extend in the second direction.

5. The semiconductor device of claim 4,
wherein a width in the second direction of the plurality of first shield elements is less than or equal to a width in the second direction of the plurality of first gate electrode elements, and
a width in the second direction of the plurality of second shield elements is less than or equal to a width in the second direction of the plurality of second gate electrode elements.

6. The semiconductor device of claim 1,
wherein the insulating layer includes:
a first insulating layer on the first surface of the semiconductor substrate filling at least a portion of the plurality of trenches and defining a first groove in which the shield layer is arranged;
a second insulating layer on the first insulating layer and defining a second groove in which the gate electrode layer is arranged; and
a third insulating layer on the second insulating layer and covering the gate electrode layer.

7. The semiconductor device of claim 1,
wherein a lower edge area of the insulating layer has an increasing width away from the semiconductor substrate in a direction that is parallel with the extension direction of the plurality of fin structures, the lower edge area being adjacent to a lower portion of the plurality of fin structures.

8. The semiconductor device of claim 1, further comprising:
a plurality of first semiconductor contact layers between the plurality of fin structures and the first conductive layer and having a doping concentration that is greater than a doping concentration of the semiconductor substrate; and
a second semiconductor contact layer between the semiconductor substrate and the second conductive layer and having a doping concentration that is greater than the doping concentration of the semiconductor substrate.

9. The semiconductor device of claim 1, further comprising:
at least one inserted semiconductor layer embedded in an area of each of the plurality of fin structures, the area being adjacent to the gate electrode layer, the at least one inserted semiconductor layer including a second semiconductor material different from the first semiconductor material.

10. The semiconductor device of claim 1,
wherein the gate electrode layer includes a gate body portion on the shield layer and a gate protrusion portion downwardly extending from an edge of the gate body portion to be adjacent to a side surface of the shield layer.

11. The semiconductor device of claim 10,
wherein the insulating layer includes:
a first insulating layer on the first surface of the semiconductor substrate filling at least a portion of the plurality of trenches and defining a first groove in which the shield layer is arranged and a second groove into which the gate protrusion portion is inserted;
a second insulating layer on the first insulating layer and defining a through-hole through which the gate protrusion portion penetrates;
a third insulating layer on the second insulating layer and defining a third groove in which the gate body portion is arranged; and
a fourth insulating layer on the third insulating layer and covering the gate body portion.

12. The semiconductor device of claim 1,
wherein each of the plurality of fin structures includes a lower area having a large width and an upper area having a small width, the small width smaller than the large width.

13. The semiconductor device of claim 1,
wherein an area of the insulating layer is inserted into the semiconductor substrate so as to be closer to the second conductive layer than other areas of the insulating layer, the area of the insulating layer being adjacent to an edge of the semiconductor substrate.

14. The semiconductor device of claim 13,
wherein an area of the shield layer is more deeply inserted into the insulating layer so as to be closer to the second conductive layer compared to other areas of the shield layer the area of the shield layer being adjacent to the edge of the semiconductor substrate.

15. The semiconductor device of claim 1,
wherein the gate electrode layer is not on an area of the insulating layer, the area being adjacent to an edge of the semiconductor substrate.

16. The semiconductor device of claim 1,
wherein the first semiconductor material includes GaN.

17. The semiconductor device of claim 1,
wherein the plurality of fin structures extend in a first direction that is parallel with the first surface and are parallel with each other.

18. The semiconductor device of claim 17,
wherein the gate electrode layer includes a plurality of gate electrode elements which extend in the first direction to be parallel with the plurality of fin structures and are parallel with each other, and
the shield layer includes a plurality of shield elements which extend in the first direction to be parallel with the plurality of fin structures and are parallel with each other.

19. A power switching system comprising:
the semiconductor device of claim 1; and
at least one passive device.

* * * * *